United States Patent
Lyles et al.

(10) Patent No.: US 12,338,686 B2
(45) Date of Patent: *Jun. 24, 2025

(54) WEAR DATA QUANTIFICATION FOR WELL TOOLS

(71) Applicant: Taurex Drill Bits, LLC, Norman, OK (US)

(72) Inventors: Dustin Lyles, Norman, OK (US); Jerry Rhoades, Norman, OK (US); Warren Dyer, Norman, OK (US); Matthew Mumma, Norman, OK (US)

(73) Assignee: Taurex Drill Bits, LLC, Norman, OK (US)

( * ) Notice: Subject to any disclaimer, the term of this patent is extended or adjusted under 35 U.S.C. 154(b) by 547 days.

This patent is subject to a terminal disclaimer.

(21) Appl. No.: 17/698,123

(22) Filed: Mar. 18, 2022

(65) Prior Publication Data
US 2022/0207689 A1 Jun. 30, 2022

Related U.S. Application Data

(63) Continuation of application No. 17/320,423, filed on May 14, 2021, now Pat. No. 11,301,989.
(Continued)

(51) Int. Cl.
*G06T 7/00* (2017.01)
*E21B 10/42* (2006.01)
(Continued)

(52) U.S. Cl.
CPC .............. *E21B 10/42* (2013.01); *E21B 12/02* (2013.01); *G06F 18/214* (2023.01); *G06F 18/24* (2023.01);
(Continued)

(58) Field of Classification Search
CPC ...... E21B 10/42; E21B 12/02; E21B 2200/20; E21B 2200/22; G06F 18/214;
(Continued)

(56) References Cited

U.S. PATENT DOCUMENTS

| 6,748,112 B1* | 6/2004 | Nguyen | G06T 3/073 382/209 |
| 11,301,989 B2* | 4/2022 | Lyles | G06V 20/647 |

(Continued)

*Primary Examiner* — Samir A Ahmed
(74) *Attorney, Agent, or Firm* — Vorys, Sater, Seymour and Pease LLP

(57) ABSTRACT

A method of quantifying wear data on a well tool includes scanning a used well tool with a scanner and thereby generating a scanned file of the used well tool, the scanner being in communication with a computer system, aligning the scanned file with an original solid model file of the used well tool and thereby obtaining and displaying an overlay output, wherein the solid model file is stored on the computer system and identifies individual wear parts of the used well tool, creating and placing a digital feature on one or more of the individual wear parts displayed on the overlay output, and calculating deviation between the solid model file and the scanned file at each digital feature of the one or more individual wear parts and thereby determining material removed from the individual wear parts of the used well tool.

20 Claims, 12 Drawing Sheets

Related U.S. Application Data

(60) Provisional application No. 63/024,754, filed on May 14, 2020.

(51) Int. Cl.
| | |
|---|---|
| *E21B 12/02* | (2006.01) |
| *G06F 18/214* | (2023.01) |
| *G06F 18/24* | (2023.01) |
| *G06F 30/10* | (2020.01) |
| *G06F 30/28* | (2020.01) |
| *G06T 7/11* | (2017.01) |
| *G06T 7/30* | (2017.01) |
| *G06T 11/00* | (2006.01) |
| *G06V 20/64* | (2022.01) |

(52) U.S. Cl.
CPC .............. *G06F 30/10* (2020.01); *G06F 30/28* (2020.01); *G06T 7/001* (2013.01); *G06T 7/11* (2017.01); *G06T 7/30* (2017.01); *G06T 11/00* (2013.01); *G06V 20/647* (2022.01); *E21B 2200/20* (2020.05); *G06T 2207/20021* (2013.01); *G06T 2207/20081* (2013.01); *G06T 2207/30164* (2013.01)

(58) Field of Classification Search
CPC .......... G06F 18/24; G06F 30/10; G06F 30/28; G06T 7/001; G06T 7/11; G06T 7/30; G06T 11/00; G06T 2207/20021; G06T 2207/20081; G06T 2207/30164; G06T 7/33; G06T 2200/24; G06T 2207/10028; G06V 20/647; G06V 2201/06
See application file for complete search history.

(56) References Cited

U.S. PATENT DOCUMENTS

| | | | |
|---|---|---|---|
| 2002/0077769 A1* | 6/2002 | Ebinger | G06T 7/30 702/150 |
| 2009/0307628 A1* | 12/2009 | Metala | G06T 7/0006 715/850 |
| 2010/0312370 A1* | 12/2010 | Lind | G06T 19/00 702/6 |
| 2013/0030773 A1* | 1/2013 | O'Hare | G01B 21/04 703/1 |
| 2016/0326808 A1* | 11/2016 | Ansari | E21B 10/43 |
| 2019/0072932 A1* | 3/2019 | Sitnikov | B29C 64/147 |
| 2019/0145183 A1* | 5/2019 | Potash | E21B 10/00 700/175 |
| 2019/0258225 A1* | 8/2019 | Link | G06T 7/70 |
| 2019/0354922 A1* | 11/2019 | Berti | G06K 7/1417 |
| 2020/0043186 A1* | 2/2020 | Selviah | G06T 7/33 |
| 2020/0095859 A1* | 3/2020 | Chen | E21B 10/43 |
| 2020/0103846 A1* | 4/2020 | Coull | B23P 6/002 |
| 2021/0174486 A1* | 6/2021 | Chowhan | G06F 18/25 |
| 2021/0291276 A1* | 9/2021 | Pelfrene | B33Y 10/00 |

* cited by examiner

FIG. 7D

WEAR DATA QUANTIFICATION FOR WELL TOOLS

BACKGROUND

In the oil and gas industry, several types of well tools are used downhole to perform various wellbore operations. Drill bits, for example, are commonly run downhole two or three (or more) times to drill a wellbore or extend its length. When a drill bit is new, its performance and drilling capability are fairly predictable and generally follow manufacturer specifications. In later stages, however, and due to uncertain operating and formation conditions, the drill bit will gradually wear and degrade into what is commonly referred to as a "dull" bit. Dull bits can slow the rate of wellbore penetration, thus requiring the drilling operator to apply more weight on bit, which, in turn, accelerates drill bit wear. Dull bits also often experience unbalanced side forces, which lead to whirl, vibration, and instability during operation. Consequently, when a drill bit becomes dull, it is commonly removed from operation and either scrapped or refurbished for subsequent use.

Determining whether a bit is scrapped or refurbished is typically based upon internal guidelines established by individual bit companies and experienced personnel within those companies. In addition to making determinations on repairability of dull bits, it is critical to document wear sustained on dull drill bits. The International Association of Drill Contractors (IADC) bit dull grading system was developed to provide a standardized protocol for evaluating drill bits to classify drill bit wear/damage and reason pulled. In the IADC dull grading process, a skilled evaluator visually inspects the dull bit and manually quantifies the observed wear using a standardized eight-field code with associated descriptors. The dull grading process, however, is a time-consuming process that is highly subjective, rarely repeatable, and often inaccurate.

Thus, what is needed is an improved method of determining and quantifying drill bit wear, which can lead to improved bit material selection, design optimization, and performance.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

FIGS. 7A-7D are example wear data reports that may be generated using an auto-generate report programming instruction, according to one or more embodiments.

DETAILED DESCRIPTION

The present disclosure is related to analyzing well tools and, more particularly, to scanning used well tools with three-dimensional or two-dimensional imaging systems and subsequently quantifying wear data.

Embodiments of the present disclosure describe methods of analyzing well tools to determine and quantify wear data. According to methods disclosed herein, a used well tool is scanned and the resulting scanned file is aligned with and compared with a solid model (e.g., CAD model) of the well tool in its as-designed state. Material loss can then be measured directly for analysis by subtracting the scanned parts from the corresponding solid model parts. One issue with conventional scanning of well tools is that the scan data is commonly represented as a single surface geometry that lacks any distinction between individual, discrete components of the well tool. Because the individual components are not discrete 3D solids in conventional scanning techniques, they cannot be easily measured.

Assemblies made up of various parts subject to wear are of interest in defining the amount of wear experienced during operation of the assembly. The presently described methods facilitate measurement of discrete volumetric and/or area wear of components and parts of well tools. The methods disclosed herein provide improved consistency, granularity (i.e., characterization), and accuracy of wear data as feedback for application specific well tool selection, design optimization, and material selection. In some cases, formation characteristics can be correlated to wear identified on well tool cutting elements, thus enabling indexing of formation abrasion, thermal and/or impact severity and probability.

Moreover, the wear or wear rate of specific materials in the well tools can be tracked over time to ensure there is no drifting of performance due to changes in materials and/or manufacturing. Wear and wear rate can also be tracked to better understand variations in lithology and/or drilling parameters of subterranean formations. Furthermore, the methods described herein may help enhance a manufacturer's ability to perform economic analysis and make material selections for well tools based on a rate of return from a performance perspective. Thus, the methods discussed herein provide quick and reliable feedback to manufacturers, operators, and tool companies to aid in optimization of drilling efficiency and economics.

Figure 1:
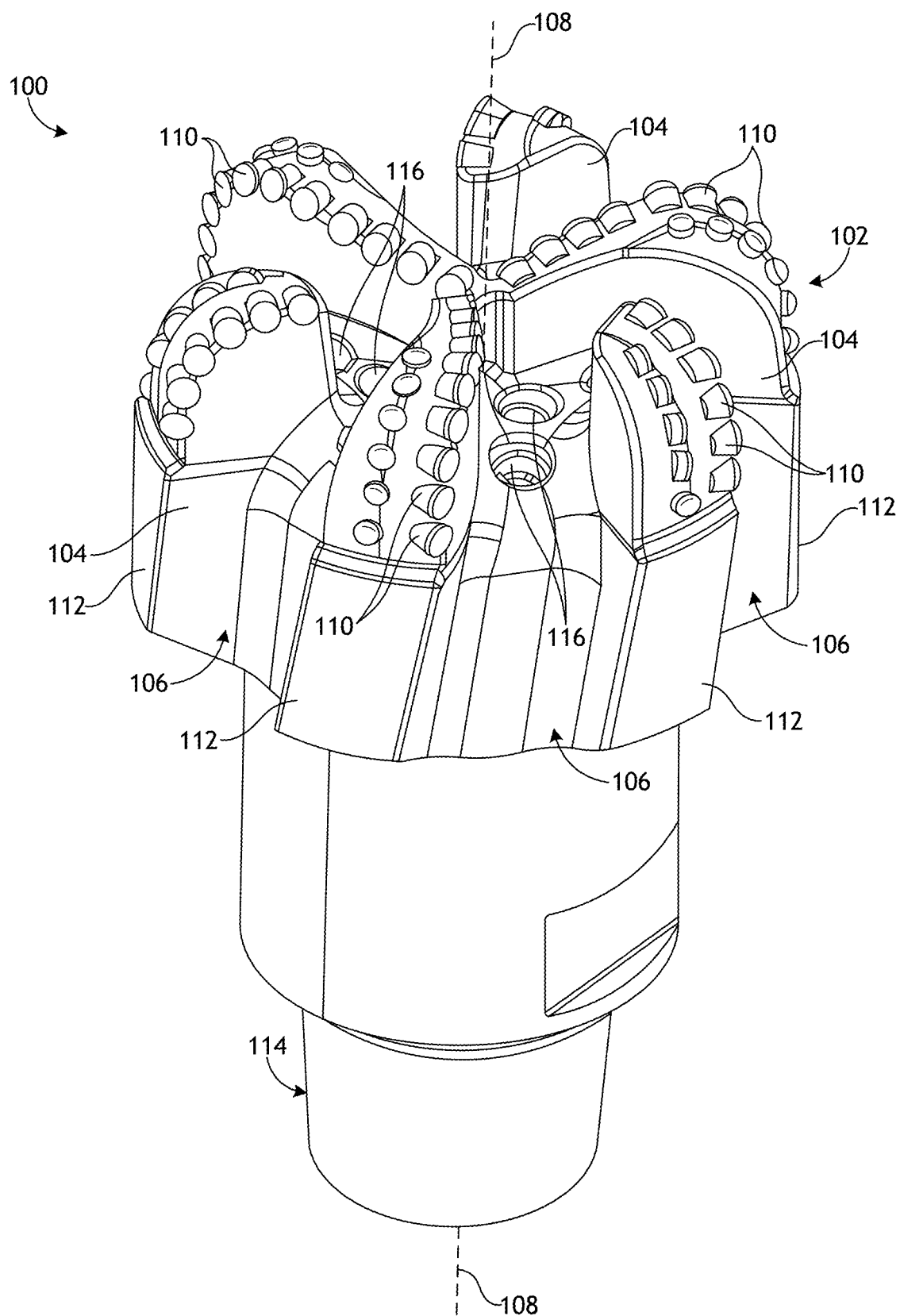
FIG. 1 is an isometric view of an example well tool that may incorporate the principles of the present disclosure.

FIG. 1 is an isometric view of an example well tool 100 that may incorporate the principles of the present disclosure.

In the illustrated embodiment, the well tool 100 comprises a rotary drill bit, but the principles of the present disclosure are equally applicable to other well tools commonly used in the oil and gas industry and corresponding to a wide variety of oilfield equipment (both surface and subsurface), well drilling equipment, well drilling tools, well completion equipment, well completion tools, well service tools, well service equipment, and/or associated components. Other examples of the well tool 100 include, but are not limited to, bit bodies associated with rotary drill bits, fixed cutter drill bits (e.g., PDC bits), drill string stabilizers, roller cone drill bits, cones for roller cone drill bits, rotary steering tools (e.g., directional tools), logging while drilling tools, measurement while drilling tools, side wall coring tools, underreamers, fishing spears, washover tools, whipstocks, production packer components, float equipment, casing shoes (e.g., a casing shoe with cutting structures), well screens, gas lift mandrels, downhole tractors, tool joints, rotors, stator and/or housings for downhole motors, blades and/or housings for downhole turbines, latches for downhole tools, and other downhole tools associated with drilling and completing a wellbore.

In the present discussion, the well tool 100 will be described with reference to the rotary drill bit depicted in FIG. 1. Consequently, the well tool 100 will alternatively be referred to herein as the "drill bit 100" or the "rotary drill bit 100". The term "rotary drill bit" refers to various types of fixed cutter drill bits, drag bits, matrix drill bits, steel body drill bits, roller cone drill bits, rotary cone drill bits, and rock bits operable to form a wellbore. As will be appreciated, rotary drill bits and associated components incorporating the teachings of the present disclosure may have many different designs, configurations, and/or dimensions.

As illustrated, the drill bit 100 includes a generally cylindrical bit body 102 that provides or otherwise defines one or more drill bit blades 104 separated by junk slots 106. The blades 104 may be provided in a wide variety of configurations including, but not limited to, substantially arched, helical, spiraling, tapered, converging, diverging, symmetrical, asymmetrical, or any combination thereof. In the illustrated embodiment, some of the blades 104 extend to a centerline 108 of the bit body 102 and may be referred to as "primary" blades, while other blades 104, referred to as "secondary" blades, do not extend to the centerline 108 and operate to "follow" the primary blades 104 during operation.

The bit body 102 can be formed integrally with the blades 104, such as being milled out of a steel blank. Alternatively, the blades 104 can be welded to the bit body 102. In other embodiments, the bit body 102 and the blades 104 may be formed of a matrix material (e.g., tungsten carbide matrix with an alloy binder) sintered and/or cast in a mold of a desired shape, with the blades 104 also being integrally formed of the matrix with the bit body 102.

The drill bit 100 further includes a plurality of cutting elements 110 (alternately referred to as "cutters") fixed to the blades 104. In some cases, some of the cutting elements 110 may be mounted at the leading face of some or all of the blades 104. Each cutting element 110 may be received within and bonded to a dedicated cutter pocket machined or cast into the bit body 102 at the corresponding blade 104. One or more of the cutting elements 110 may include a cutting table or face bonded to a substrate secured within a corresponding cutter pocket. The cutting table may be made of a variety of hard or ultra-hard materials such as, but not limited to, polycrystalline diamond (PCD), sintered tungsten carbide, thermally stable polycrystalline (TSP), polycrystalline boron nitride, cubic boron nitride, natural or synthetic diamond, hardened steel, or any combination thereof. The substrate may also be made of a hard material, such as tungsten carbide or a ceramic. In other embodiments, however, one or more of the cutting elements 110 may not include a cutting table. In such embodiments, the cutting elements 110 may comprise sintered tungsten carbide inserts without a cutting table and bonded to corresponding cutter pockets. The cutting elements 110 may be bonded to the corresponding blade 104 such that they are fixed or alternately allowed to rotate.

The cutting elements 110 may comprise any suitable cutter designed to cut, gouge, and/or scrape into underlying rock formations as the bit body 102 rotates during downhole operation. The cutting elements 110 can include primary cutting elements, back-up cutting elements, secondary cutting elements, or any combination thereof. In some applications, other types of cutting elements may be fixed to various portions of the primary or secondary blades 104. Such cutting elements can include, but are not limited to, cutters, compacts (e.g., polycrystalline diamond compacts or "PDC"s), buttons, inserts, and gage cutters suitable for use with a wide variety of drill bits. In some cases, the blades 104 may also include one or more depth of cut controllers (DOCCs) configured to control the depth of cut of the cutting elements 110. Various features may also be affixed to the blades 104 to mitigate vibration.

Moreover, the drill bit 100 may further include one or more gauge pads 112 provided on outer radial portions of the blades 104 to contact radially adjacent portions of the drilled wellbore. The gauge pads 112 operate to provide added stability and protection to gauge cutting elements (if any) while maintaining a predetermined diameter of the drilled wellbore. The gauge pads 112 may also contain one or more cutting elements in order to enhance the ability of the well tool to maintain a properly gauged well bore.

The drill bit 100 further includes a pin 114 that defines American Petroleum Institute (API) drill pipe threads used to releasably engage the drill bit 100 with drill pipe or a bottom-hole assembly (BHA) whereby the drill bit 100 may be rotated relative to the centerline 108. In example operation, as the drill bit 100 advances into the earth, a drilling fluid (e.g., water, drilling mud, etc.) is communicated to one or more nozzles 116 provided in the bit body 102 to cool and lubricate the drill bit 100. The drilling fluid is discharged from the nozzles 116 and into the junk slots 106, and a mixture of drilling fluid, formation cuttings, and other downhole debris flow through the junk slots 106 to be returned to the well surface via the annulus of the drilled wellbore.

Operation of the drill bit 100 in downhole environments inevitably causes wear and tear on the drill bit 100, which gradually decreases its efficiency and effectiveness. Eventually the decreased drilling efficiency of the drill bit 100 outweighs the drilling interests and the drill bit 100 must be returned to the surface and replaced or refurbished.

As indicated above, dull bits are either scrapped or refurbished for subsequent use and, in some cases, this determination is reached by a skilled evaluator. Because the dull grading process is time-consuming, highly subjective, and often inaccurate, other wear analysis techniques have been developed to provide more efficient means of wear data quantification. For example, worn well tools, such as drill bits, can be digitally scanned to obtain and process three-dimensional (3D) images of the worn well tools that help manufacturers determine whether a worn well tool should be scrapped or refurbished. Moreover, metrology software has been developed to calculate wear by comparing separate models, but conventional scanning techniques quantify wear (i.e., deviation) for a body as a whole, and are not designed to distinguish wear/deviation for separate, distinct parts or components within one scanned image. More specifically, conventional methods of scanning well tools to determine material loss (volumetric and/or area) typically generate scan data represented as a single, monolithic surface geometry that lacks any distinction between the individual, discrete components (parts) of the well tool. Because the individual components are not discrete 3D solids, they cannot be measured independently but only as part of the whole. It is believed that no solution has previously been disclosed that automates material loss/wear calculations for individual, discrete wear parts or components of a well tool.

According to the present disclosure, when evaluating the wear state and characteristics of a well tool, such as the drill bit 100, wear is linked and/or correlated to specific regions or "wear parts" of the well tool. As used herein, the term "wear parts" refers to parts, components, or regions of a well tool that have a higher susceptibility to wear and tear during operation as compared to other parts, components, or regions of the well tool. Wear parts on the drill bit 100, for example, include at least the blades 104, the cutting elements 110, and the gauge pads 112 due to the significant variation of forces applied to these individual regions across the bit profile. In some embodiments, wear parts can also include depth of cut controllers (DOCCs), if present. Additionally, these separate regions of the bit profile experience various forms and severity of impact loading/instability, perform varying degrees of work, travel at varying speeds, and travel highly variable distances.

The methods described herein automate the process of scanning a worn well tool, selecting wear parts of interest on a three dimensional solid model of the well tool generated by means of computer-aided design (CAD) software, aligning the solid and scanned models of the well tool, and calculating the deviation (wear) between the scanned part and the solid model part, thus providing a user (e.g., an operator, a tool company, etc.) with the material loss (volumetric and/or area) at the wear parts of interest. As will be appreciated, the methods described herein may be advantageous over the time-consuming and subjective manual process of analyzing dull drill bits. Whereas manually analyzing a dull drill bit can require several hours of manual labor, the methods disclosed herein can be accomplished in just minutes.

Figure 2:
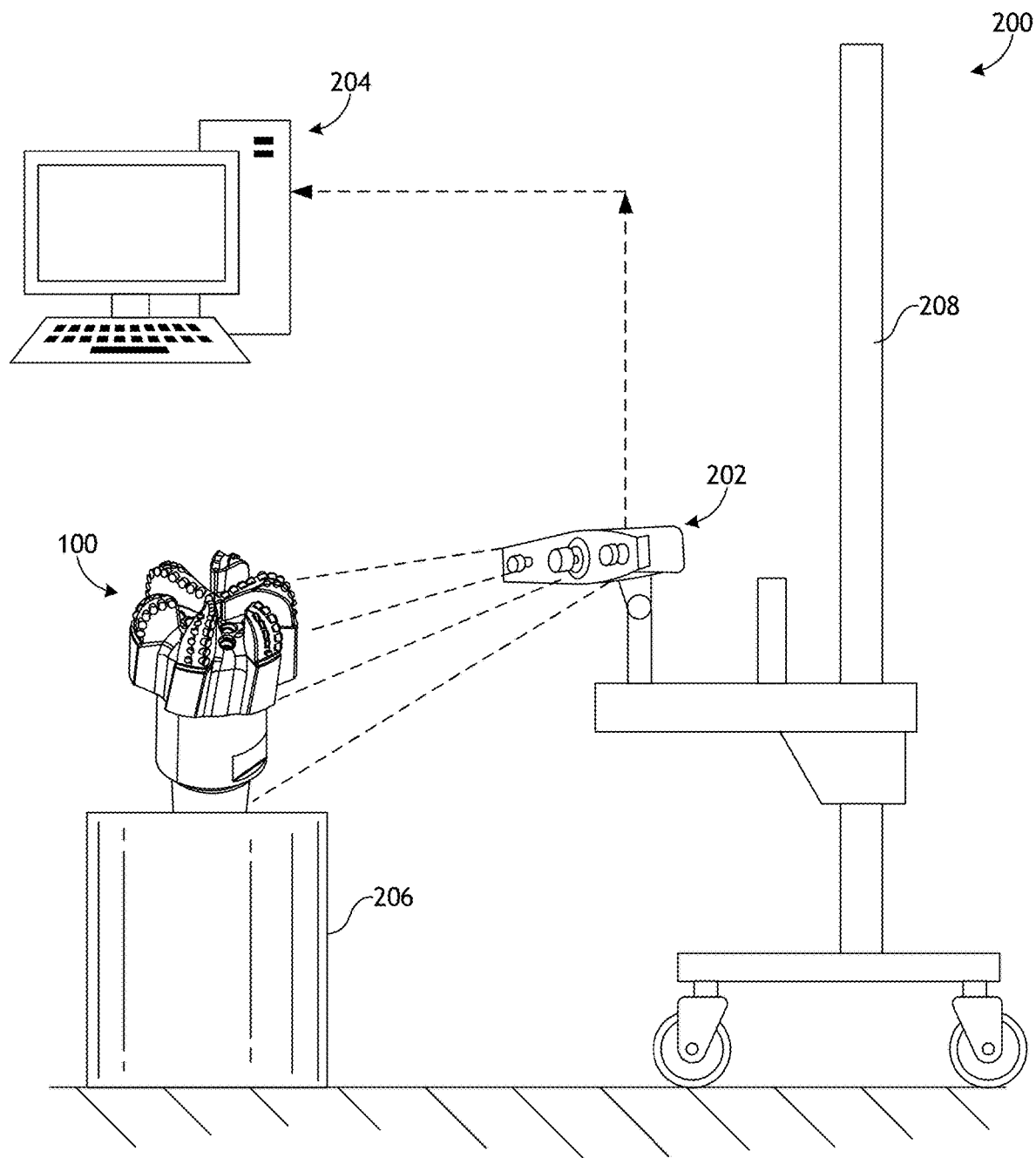
FIG. 2 is a schematic diagram of an example scanning system that may incorporate the principles of the present disclosure.

FIG. 2 is a schematic diagram of an example scanning system 200 that may incorporate the principles of the present disclosure. The scanning system 200 (hereafter "the system 200") may be configured to scan a well tool, such as the drill bit 100. As illustrated, the scanning system 200 includes a scanner 202 and a computer system 204 in communication with the scanner 202. In some embodiments, the computer system 204 may include two or more computers (e.g., multi-pc workflow) networked together or otherwise capable of communicating one with the other. Having more than one computer may be advantageous in increasing capacity (e.g., maximizing number of well tools scanned without delay due to inspection) while creating real-time/simultaneous inspections upon completion of a scan. In such embodiments, for example, the computer system 204 may include a scanning computer separate from an inspection computer, among other computer devices.

The scanner 202 may be positioned to obtain scanned images of the drill bit 100, which may be positioned on a stand 206. In some embodiments, the scanner 202 may be designed to obtain three-dimensional (3D) images of the drill bit 100 and may thus comprise a type of 3D scanner or 3D scanning system. For purposes of this disclosure, the term "3D scanner" or "3D scanning system" refers to any assembly by which distance data may be collected or calculated and reconstructed to extrapolate the shape of an object (e.g., a well tool). Such assemblies may refer to any kind of 3D scanning system, including contact or non-contact 3D scanners, such as a time-of-flight 3D laser scanner, a triangulation 3D scanner, a structured light 3D scanner, an optical 3D scanner, stereoscopic scanners, general photography devices, or any combination thereof. Further, in one or more embodiments, the 3D scanning system may be an internal component of an electronic device or a separate external component connected to an electronic device operable at will by a user.

In other embodiments, however, the scanner 200 may be designed to obtain high-resolution two-dimensional (2D) images of the drill bit 100, without departing from the scope of the disclosure. In such embodiments, the scanner 200 may comprise a high-resolution camera or the like capable of obtaining high-resolution 2D photographic (still) images and/or video. Moreover, in such embodiments, the computer system 204 may be programmed or otherwise configured to implement photogrammetry techniques to gather measurements and data about the well tool by analyzing the change in position from two or more different images. Accordingly, the principles of the present disclosure are equally applicable to 2D scanning operations.

In some embodiments, the scanner 202 may be mounted to a support assembly 208 capable of moving the scanner 202 about the drill bit 100 to capture scanned images (3D or 2D) of all exterior portions of the drill bit 100. The support assembly 208 may include, for example, one or more robotic arms and/or lifts that may help maneuver and position the scanner 202 at all required angles and locations relative to the drill bit 100. In some embodiments, the support assembly 208 may be automated, but may alternatively be manually operated. In some embodiments, the scanner 202 may remain stationary and the stand 206 may alternatively be rotatable and/or movable up and down to help enable adequate scanning of the drill bit 100. In yet other embodiments, the scanner 202 may comprise a hand-held scanning system and a user or operator may hold the scanner 202 and walk around the periphery of the drill bit 100 while digitally "painting" the drill bit 100 with the scanner 202 to obtain the necessary scanned images (3D or 2D).

In some embodiments, the drill bit 100 may be prepared for scanning, such as by applying reflective markers to assist in stitching the 3D scan together, applying matting spray to remove reflective glare, and the like. The scanner 202 may be designed to operate with an accuracy of approximately 0.0005-0.003 inches or better.

The scanner 202 may communicate with the computer system 204 via any known wired or wireless means. In at least one embodiment, the computer system 204 may comprise one component of a larger computer network. The computer system 204 may include a processor and a non-transitory, computer readable medium (i.e., a memory) programmed with computer-executable instructions that, when executed by the processor, perform the methods described herein. More particularly, the computer system 204 may have 3D modeling and metrology software stored thereon, which may include instructions to receive and process images captured by the scanner 202 and generate a 3D image of the drill bit 100 based on the captured images.

The 3D image of the drill bit 100 may comprise a scanned "mesh" file (e.g., .stl, point cloud, IGES, STEP, etc.) comprising a complex polygon mesh structure corresponding to the scanned dimensions and configurations of the drill bit 100 as obtained by the scanner 202. As described in more detail below, the scanned file of the drill bit 100 may be compared against a solid model (e.g., a computer-aided design or CAD solid model) file of the drill bit 100 corresponding to the original manufacturer specifications for the drill bit 100. The scanned file may be spatially aligned with the corresponding solid model file and any deviation between individual scanned parts (regions) and the corresponding solid model parts may be indicative of how much wear the drill bit 100 experienced during operation. Such comparisons may be used to quantify, often in a digital format, specific amounts of abrasion, erosion, and/or wear of associated blades 104 (FIG. 1), cutting elements 110 (FIG. 1), and/or gauge pads 112 (FIG. 1), for example.

Figure 3:
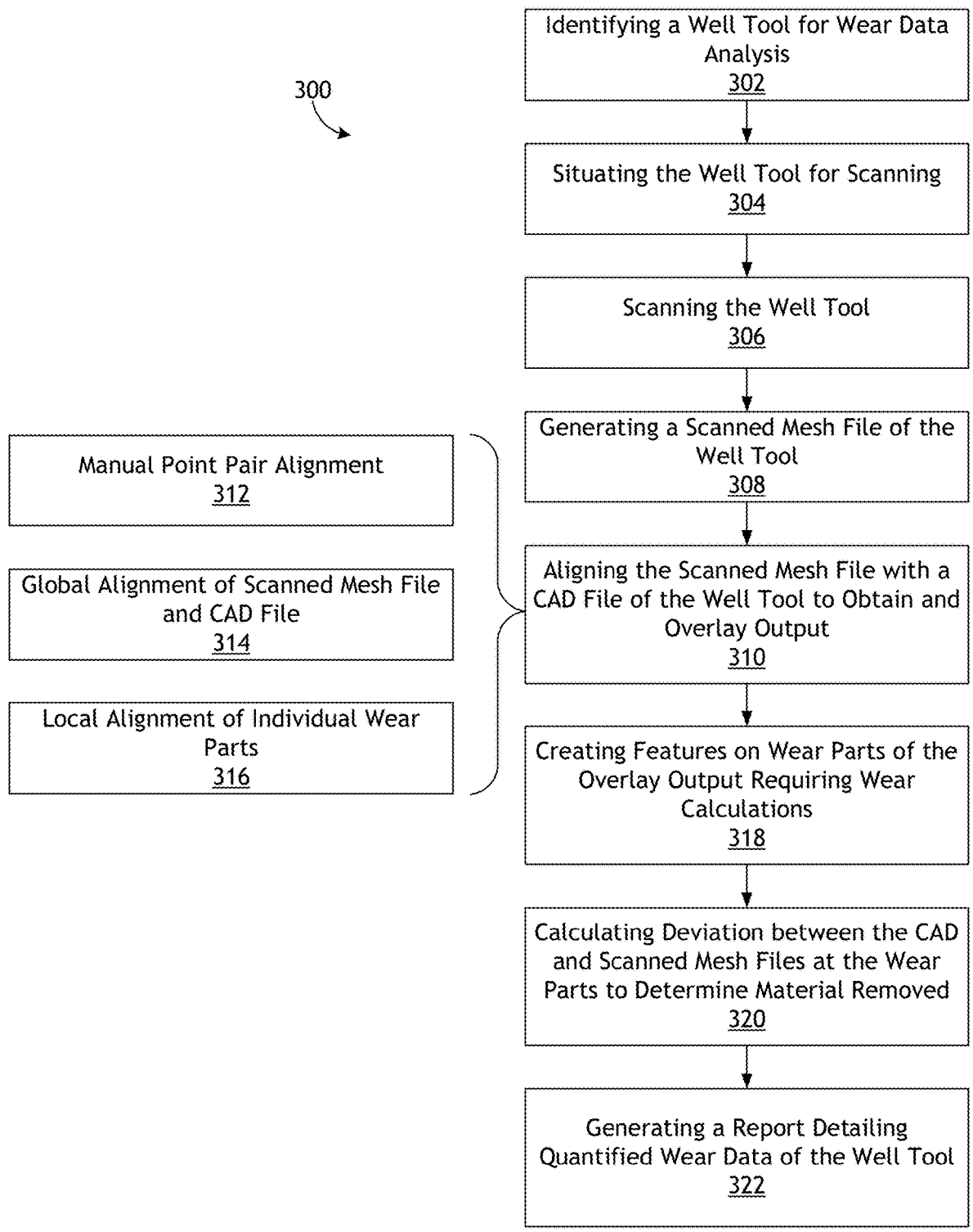
FIG. 3 is a process flow diagram of an example method of determining and quantifying wear data on a well tool, according to one or more embodiments.

FIG. 3 is a process flow diagram of an example method 300 of determining and quantifying wear data on a well tool, according to one or more embodiments. The method 300 will be discussed with respect to determining and quantifying wear data of the drill bit 100 of FIGS. 1-2, but it will be appreciated that the method 300 may alternatively be used to determine and quantify wear data of any of the well tools or associated components mentioned herein. Moreover, the method 300 may also incorporate and use the scanner 202 (FIG. 2) and the computer system 204 (FIG. 2) described herein to help determine and quantify the wear data.

As illustrated, the method 300 may first include identifying a well tool for wear data analysis, as at 302. The well tool must be properly identified in order to be able to run the software programming instructions that facilitate automated wear data quantification. In this step, the dull drill bit 100 (or any other well tool mentioned herein) may be identified by the computer system 204 (FIG. 2) based on original design and preparation files used to manufacture the drill bit 100. The design and preparation files can include, but are not limited to, solid models (e.g., CAD files) and data files (e.g., comma separated variable or "CSV" files) corresponding to the drill bit 100, and may be prepared based on tool features such as part number, outer diameter, cutter size, blade count, etc. In at least one embodiment, the data file could be programmatically generated based on the embedded parts and details provide in the solid model file. More specifically, an operator may be able to merely input a part number or the like and the computer system 204 may be configured to pull the necessary data file information from the solid model file. In such embodiments, the information for the data file may be embedded within the solid model file or otherwise within the bit manufacturer's bit design database.

Both the solid model and data files will be separable into common wear parts of the drill bit 100, such as the blades 104 (FIG. 1), the cutting elements 110 (FIG. 1), and the gauge pads 112 (FIG. 1). This separable data will be required to enable the computer system 204 to run the wear data quantification programming instructions (e.g., macros) described herein and obtain wear data quantification for individual (discrete) wear parts, as opposed to a volumetric material loss for the drill bit as a whole, or performing manual procedures to quantify wear.

The solid model file may be saved in the computer system 204 (FIG. 2) such that the common wear parts of the drill bit 100 are separately identified but embedded in a main assembly file. Accordingly, the main assembly file is comprised of the bit body 102 (FIG. 1) along with the wear parts and any other discrete parts or components that are cast, welded, or otherwise attached to the bit body 102.

Similarly, the data file may be saved in the computer system 204 (FIG. 2) with separate wear parts of the drill bit 100 being separately identifiable, as is common to data files. More specifically, the data file may include various part parameters related to the drill bit 100, such as bit size, bit description, scale CAD factor, the CAD part name for each cutting element 110 (FIG. 1), a list of cutting element 110 numbers (as assigned in the main assembly CAD file), the CAD part name for each blade 104 (FIG. 1), the corresponding blade 104 number for each cutting element 110, the nominal area/volume value for each cutting element 110, wear tolerances (if applicable/desired), nominal gauge diameter for the bit body 102 (FIG. 1), DOCC elements, and features of any DOCC elements.

In the event some of the cutting elements 110 comprise shaped (non-cylindrical) cutters, which exhibit a different nominal value than traditional cylindrical cutters, the data file may include (indicate) the appropriate nominal value for each cutting element 110. In some embodiments, for example, shaped and cylindrical cutting elements 110 may be used in an alternating layout along the blades 104 (FIG. 1) based on the radial position of the cutters on the profile. In such embodiments, the appropriate nominal area value may be applied to the varying cutter geometries to ensure accurate area/volume wear measurements, which would otherwise be erroneous if only one nominal value were applied to all cutting elements 110.

The well tool may then be properly situated in preparation for scanning, as at 304. The drill bit 100, for example, may be positioned on the stand 206 (FIG. 2) adjacent the scanner 202 (FIG. 2). In some embodiments, properly situating the drill bit 100 on the stand 206 may entail aligning one of the blades 104 (FIG. 1) with a predetermined angular orientation or coordinate (e.g., 270°). Such alignment may prove advantageous in enabling operators (e.g., scanner operators) to automate subsequent scanning processes with drill bits having the same part number. In other embodiments, a fixturing apparatus could be used to facilitate consistent alignment of the well tool when situating the well tool on a stand for scanning. In this scenario, the fixturing would also be modelled with the well tool to aid in alignment. In yet other embodiments, a datum feature could be designed into the well tool to allow for a datum-based alignment process.

Various tool data corresponding to the drill bit 100 may then be uploaded to the computer system 204 (FIG. 2) by the user to enable the computer system 204 to subsequently relate a scanned file of the drill bit 100 with the design and preparation CAD and data files. Example tool data that may be uploaded include, for instance, the part number, the serial number, and operation information for the drill bit 100. The operation information refers to where the drill bit 100 was used (commissioned), and such information may be subsequently correlated to the wear data. In some embodiments, the tool data corresponding to the drill bit 100 may be manually uploaded to the computer system 204. In other embodiments, however, the tool data may be obtained and uploaded electronically, such as by scanning a barcode corresponding to the specific drill bit 100, which will automatically upload the corresponding tool data from a database or data file, or both.

The well tool may then be scanned, as at 306. As indicated above, the scanner 202 (FIG. 2) may be operated to obtain multiple scanned images (3D or 2D) of the drill bit 100 from all angles and covering all exterior surfaces of the drill bit 100. These images may be subsequently transmitted to the computer system 204 (FIG. 2) for processing and generation of a scanned file corresponding to the drill bit 100, as at 308.

Once the scan of the well tool is complete, the computer system 204 may be programmed to run a first or "data import and preparation" programming instruction. In some embodiments, the 3D modeling and metrology software stored on the computer system 204 is automatically opened upon scan completion, and the 3D modeling and metrology software may be programmed to run the data import and preparation programming instruction. The data import and preparation programming instruction instructs the computer system 204 to import the 3D images obtained by the scanner 202 (FIG. 2) and generates the scanned file from the 3D images. As provided above, the scanned file consists of a 3D model comprising a complex polygon mesh structure corresponding to the scanned dimensions and configurations of the drill bit 100.

The data import and preparation programming instruction also instructs the computer system 204 to load the applicable design and preparation files corresponding to the drill bit 100. More specifically, the solid model files related to the drill bit 100 are loaded based on the tool data entered by the user prior to scanning the drill bit 100; e.g., the part number, the serial number, etc. of the drill bit 100. Moreover, the solid model files may be organized and renamed based on the dialogue tree of the data (e.g., CSV) files corresponding to the drill bit 100. This may be advantageous in organizing the cutting elements 110 (FIG. 1) by blade 104 (FIG. 1) and relative cutter position for subsequent feature generation, wear calculations, and reporting. In some applications, the dialogue tree includes the main assembly CAD model expanded with a view of the embedded parts of the well tool. The dialogue tree can include native naming and organization of other embedded parts that make up the main assembly. For example, the cutting elements 110 (FIG. 1) can be designated in the dialogue tree for wear calculations in an updated organization and naming sequence to facilitate preferred reporting. In at least one embodiment, the dialogue tree includes branch names, object names (including measurements, color maps, etc.), index numbers, and icons.

The method 300 may further include aligning the scanned file of the well tool with the solid model file corresponding to the well tool to obtain an overlay or "mated" output, as at 310. In some embodiments, properly aligning the scanned file with the solid model file may comprise three or more alignment steps or stages that may be performed to ensure proper alignment for the subsequent programming instructions that will be run to accurately record wear data. In the first alignment step, the data import and preparation programming instruction may prompt the user to undertake a manual point pair alignment between the scanned file and the corresponding solid model file, as at 312. Manual point pair alignment may be used to generally align the scanned file with the solid model file, and helps positively locate and identify wear parts of interest in the drill bit 100, such as each cutting element 110 (FIG. 1), each blade 104 (FIG. 1), and each gauge pad 112 (FIG. 1). This can be done by marking particular surfaces or parts on the solid model file with a unique identifier, and then making a corresponding mark on the same surfaces or parts of interest provided by the scanned file.

Figure 4:
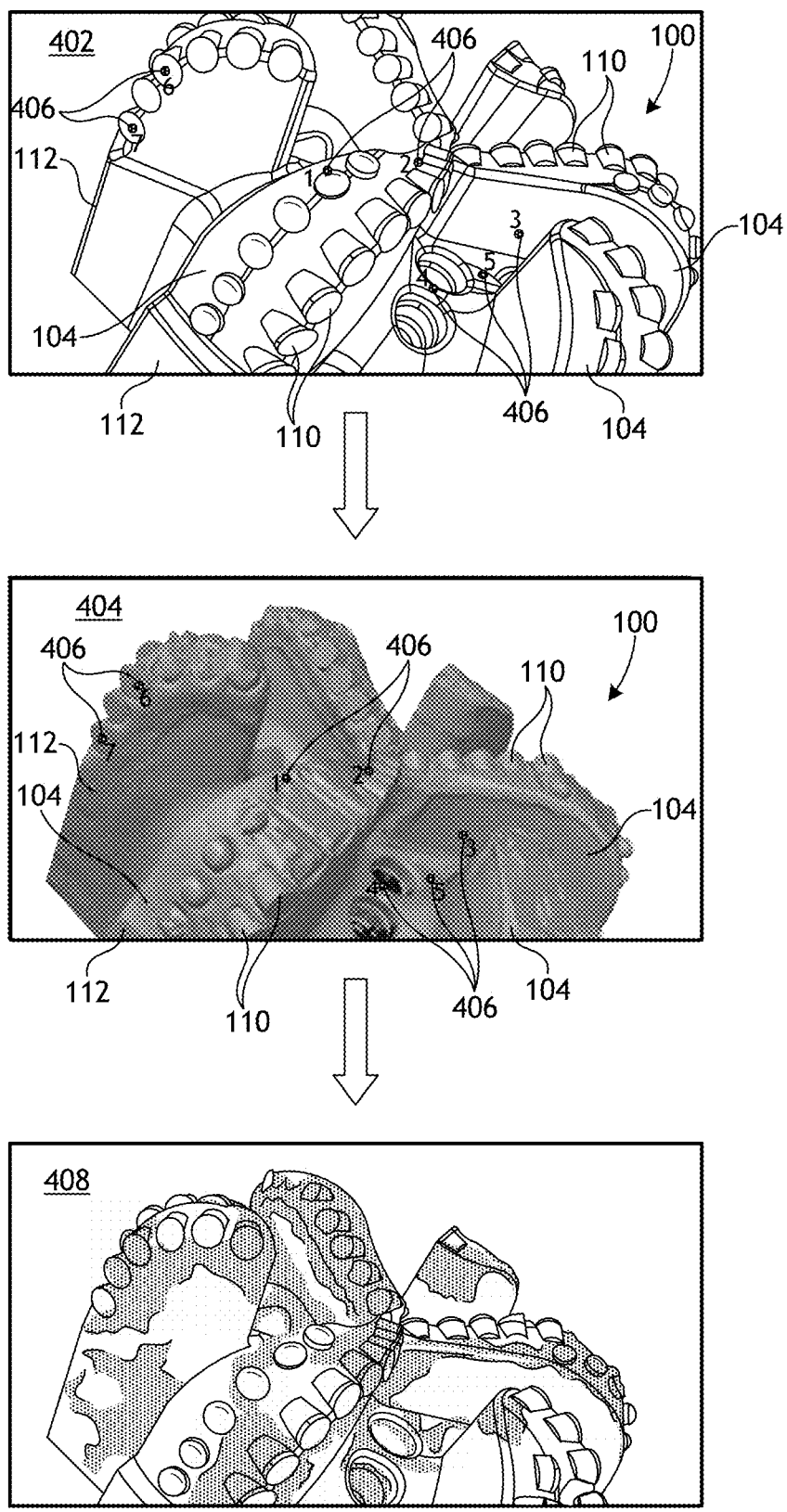
FIG. 4 depicts example solid model and scanned file outputs to which manual point pair alignment has been undertaken, according to one or more embodiments.

Referring briefly to FIG. 4, illustrated is an example solid model file output 402 and an example scanned file output 404 on which manual point pair alignment has been undertaken, according to one or more embodiments. As illustrated, several particular surfaces and parts of the drill bit 100 have been manually (e.g., electronically via a computer) marked by the user on the solid model file output 402 with unique identifiers 406. Corresponding marks in similar locations have also been manually placed on the scanned file output 404 with the same unique identifiers 406 to indicate the same surfaces and parts of interest, thus linking the solid model file to the scanned file. Consequently, the cutting elements 110 included in the solid model file will be aligned with the corresponding cutting elements 110 provided in the scanned file, the blades 104 included in the solid model file will be aligned with the corresponding blades 104 provided in the scanned file, and the gauge pads 112 included in the solid model file will be aligned with the corresponding gauge pads 112 provided in the scanned file.

The result of the manual point pair alignment is an overlay (mated) output 408 of the CAD and scanned files, which provides a rough alignment of the two file outputs 402, 404. In some embodiments, the manual point pair alignment may require 5 to 20 or more unique identifiers 406 to be placed on both the solid model file output 402 and the scanned file output 404 to achieve the rough alignment. In at least one embodiment, the manual point pair alignment step 312 may alternatively be automated by using datums and cutter position files.

Referring again to FIG. 3, in one or more embodiments, the manual point pair alignment of step 312 may be required only for new (unknown or not previously scanned) well tools with new (unknown) part numbers. For example, when a subsequent drill bit having the same part number as the drill bit 100 is scanned, the data import and preparation programming instruction may be configured to automate the point pair alignment for the subsequent drill bit since its features and design will be the same as the previously scanned and aligned drill bit 100. Automating the point pair alignment for additional well tools with same part numbers may be possible, however, only if the well tools are properly situated (oriented) and aligned for scanning, as discussed above in step 304.

Once the point pair alignment occurs, a second alignment step may ensue to globally align the scanned file with the solid model file, as at 314. More specifically, the data import and preparation programming instruction may then trigger a global alignment performed within the 3D modeling and metrology software that takes the rough point pair alignment and transforms it to a tighter alignment. In this process, a best-fit global alignment is created between all surfaces of the scanned mesh and solid model file outputs 402, 404 (FIG. 4), which provides a more accurate alignment between the scanned mesh and solid model files. In this process, all surfaces of the well tool may be utilized to achieve a best-fit alignment.

In some embodiments, a third alignment step may then be undertaken to perform a local alignment of individual wear parts of the well tool requiring wear calculations, as at 316. The third alignment step takes into consideration shrinkage in manufacturing processes of cast bits that may cause the scanned file to deviate from the solid model file based on manufacturing deviations or tolerances. More specifically, this step is designed to remove inconsistencies in positioning of the wear parts between the solid model and scanned files that result from shrinkage and/or deviations inherent in any manufacturing processes. This is accomplished by performing alignments on the individual wear components on an individual basis, thus eliminating the bit body and any positioning inconsistencies. Without this step, if a given wear part were out of position by even a small degree, the point clouds would not represent the wear part but rather the region surrounding the wear part.

In some embodiments, step 316 may alternatively be accomplished using a local best fit to critical feature alignment method. The local best fit to critical feature alignment may be undertaken to improve local cutter alignment if a substantial portion of the tungsten carbide substrate or cutting/diamond table are worn or missing. For instance, if the tungsten carbide substrate on the back portion of the cutter has suffered severe erosion, the alignment step could be skewed because so much of the feature is missing. An improved alignment could be performed by aligning only "critical features" of the cutter that did not sustain wear. In this example, this may entail using the cutting/diamond table only for alignment purposes. As will be appreciated, the inverse could be applied if the cutting/diamond tables are substantially worn or missing. The local best fit to critical feature alignment method may be done manually by an operator, or the process may be automated using the computer system 204.

In some embodiments, the data import and preparation programming instruction in the third alignment step 316 may be programmed to provide local alignment of each cutting element 110 (FIGS. 1 and 4) and cutter cylinder of the scanned file with the corresponding portions of the 3D file. This step reduces the alignment process to only cutter surfaces since without accurate local cutter-to-cutter alignment, the resulting wear data would be erroneous. As a result, each cutting element 110 is aligned on a one-by-one basis for optimal alignment, and regardless of deviations present between the scanned mesh and solid model files.

Once the alignment sequence(s) is/are complete, as at 310, the method 300 may then proceed to create features on wear parts of the scanned file requiring wear calculations, as at 318. More specifically, once alignment is complete and the overlay output 408 (FIG. 4) is generated, the computer system 204 may be programmed to run a second or "create dimensions" programming instruction, which may be programmed into the 3D modeling and metrology software. The create dimensions programming instruction may be configured to create and place digital features on specific wear parts of the overlay output 408 of the drill bit 100 that will undergo wear calculations.

Figure 5A:
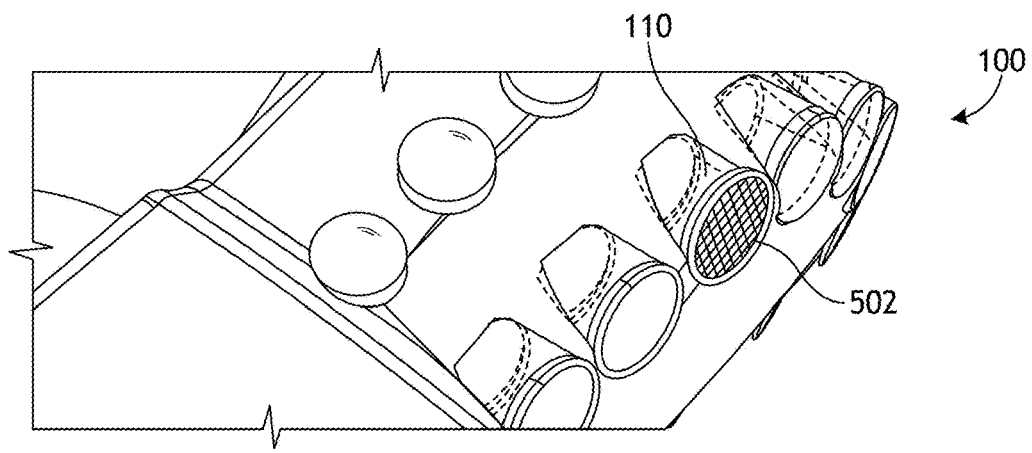
FIGS. 5A and 5B depict example digital features applied to specific wear parts of the drill bit of FIG. 1, according to one or more embodiments.

Referring to FIG. 5A, in some embodiments, a digital feature in the form of a digital plane 502 may be created and aligned with the cutter face of each cutting element 110 of the drill bit 100, and based on values obtained from the data file corresponding to the drill bit 100. As illustrated, the digital plane 502 may comprise a circle, an ellipse, or any other geometric shape sufficient to align with the corresponding cutter face of each cutting element 110.

Figure 5B:
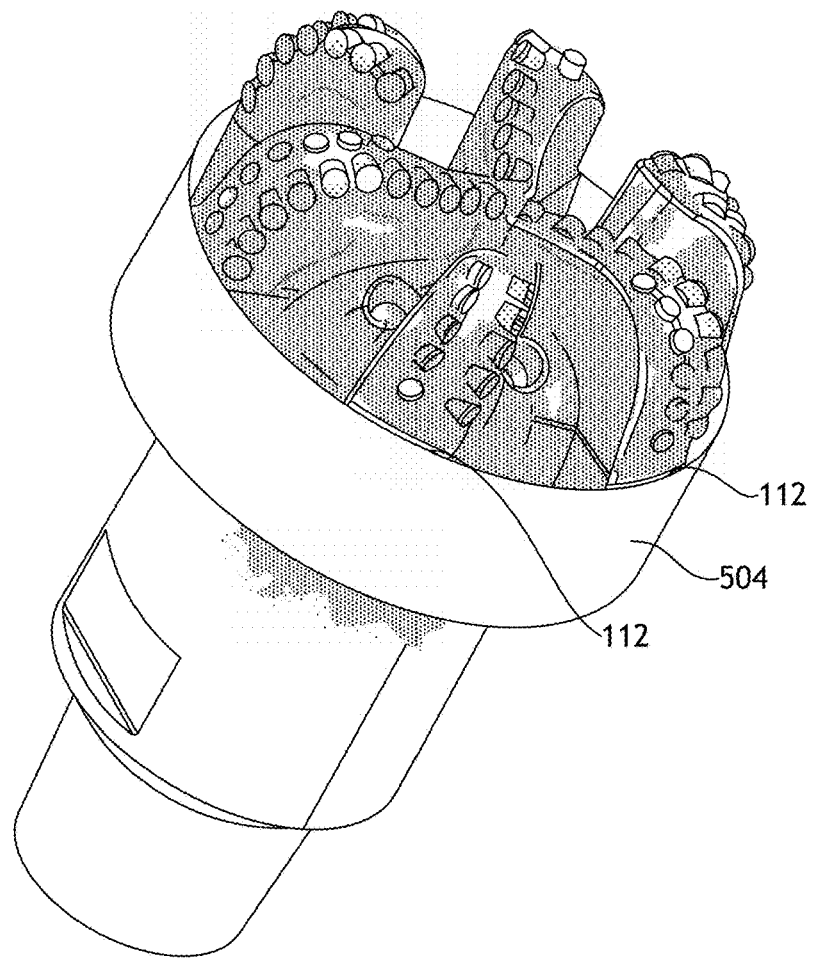

Referring to FIG. 5B, in other embodiments, or in addition thereto, a digital feature in the form of a digital cylinder 504 may be created and aligned with the gauge pads 112 of the drill bit 100. More specifically, the digital cylinder 504 may be created based on the manufactured diameter of the drill bit 100, as obtained from the corresponding data file, or as extracted/measured from the CAD model. The digital cylinder 504 may help determine the gauge diameter measurement when undertaking wear calculations, thus helping determine the true (actual) gauge of the drill bit 100 after it exits the wellbore. This may help quantify the amount of material removed, and may also help specify if the gauge pads 112 are out of tolerance, if at all, and by what amount.

Referring again to FIG. 3, the method 300 may further include calculating the deviation between the solid model file and the scanned file at each wear part and thereby determining material removed from the wear parts of the well tool, as at 320. Once all the digital features have been created, the computer system 204 may be programmed to run a third or "volume/area calculation" programming instruction, which may be programmed into the 3D modeling and metrology software. The volume/area calculation programming instruction may be configured to retrieve nominal values that were set for the cutter dimensions (e.g., area and/or volume) of each cutting element (FIGS. 1, 4, and 5A) and the outer diameter of the bit body 102 (FIG. 1) at the gauge pads 112 (FIGS. 1, 4, and 5B). Such nominal values may be retrieved from the data file or CAD dimensions corresponding to the drill bit 100. The volume/area calculation programming instruction may then be programmed to compare the nominal values to the scanned file to quantify the area or volume removed from the wear parts, or wear scar distance at the wear parts. In some embodiments, the diamond area removed (DAR) from the cutting elements 110 and the amount of material removed at the gauge pads 112 may be determined.

Figure 6A:
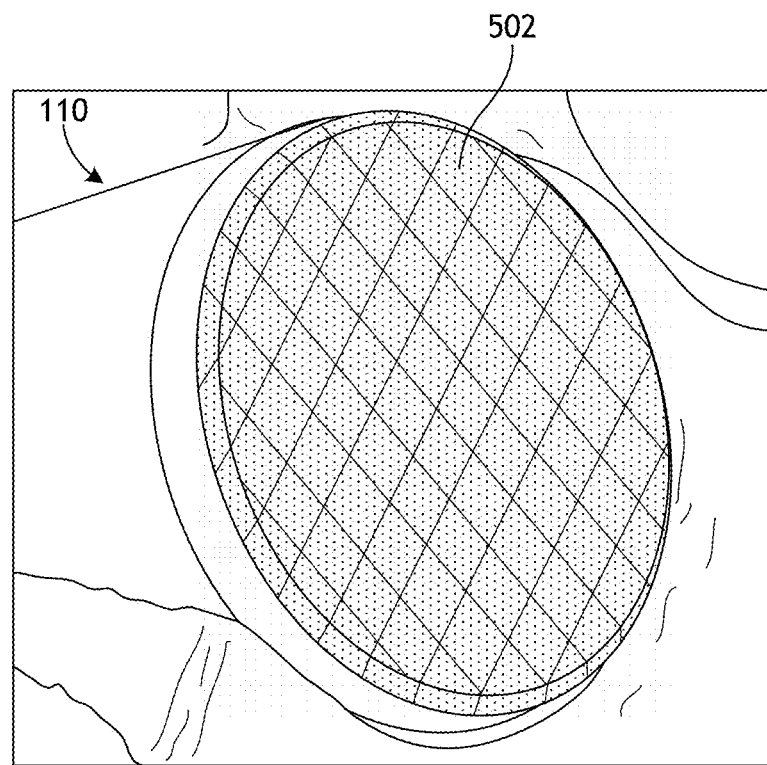
FIGS. 6A and 6B depict enlarged images of an example cutting element demonstrating area point cloud measurements, according to one or more embodiments.
Figure 6B:
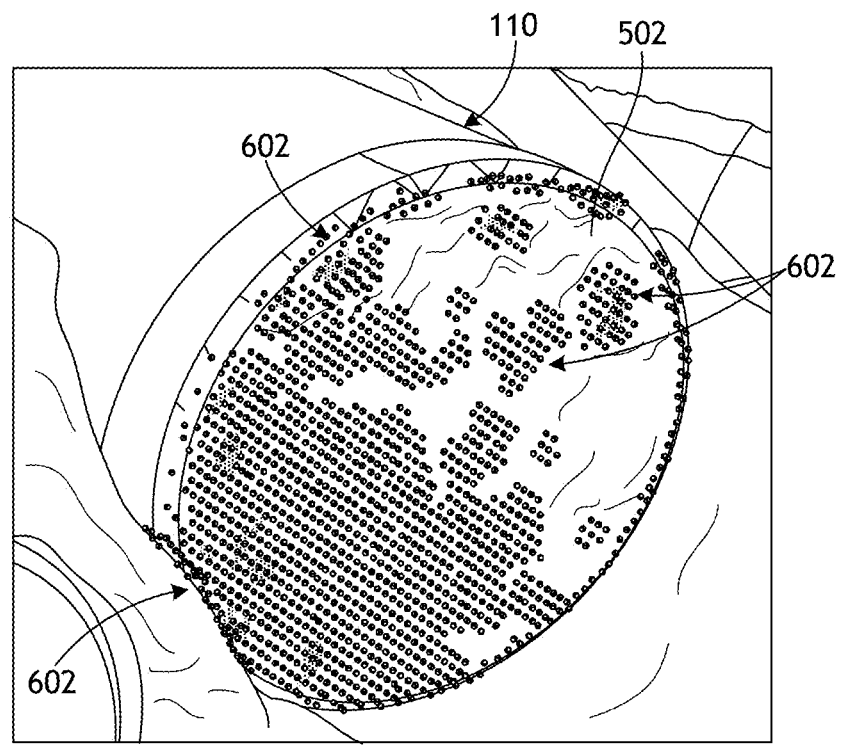

Referring to FIGS. 6A and 6B, depicted are enlarged images of an example cutting element 110 demonstrating surface area material loss, according to one or more embodiments. More specifically, FIG. 6A depicts the cutting element 110 with the digital plane 502 applied thereto and aligned with the cutting face, as generally described above. The volume/area calculation programming instruction may be programmed to use predetermined presets to measure the distance from the digital plane 502 to the actual scanned surfaces of the scanned file. The predetermined presets (e.g., alignment parameters) define at what depth to look for point clouds. This takes into account minor misalignments that can occur as well as spalling or thin layers of diamond loss. FIG. 6B depicts point cloud data points 602 where the digital plane 502 aligns with the scanned file at the cutter table. Locations on the cutter face where no point cloud data points 602 are observed represent areas where the cutter table has eroded or worn away.

The volume/area calculation programming instruction may be programmed to quantify the area of the point cloud data points 602 and assign a value to each cutting element 110. From that value, the volume/area calculation programming instruction may be programmed to calculate the DAR for each cutting element 110 and may place all measurements into comma separated variable (CSV) format as well as assign calculations in the corresponding dialogue tree. Associating the DAR values with the individual cutting elements 110 in the dialogue tree of the metrology software helps facilitate viewing and/or reporting visual annotations of the DAR values on the model within subsequently-generated reports and/or the software. As will be appreciated, similar calculations can be undertaken at the gauge pads 112 (FIGS. 1, 4, and 5B) using the digital cylinder 504 to determine how much material was removed from the outer diameter of the drill bit 100 during operation.

Referring again to FIG. 3, the method 300 may further include generating one or more reports detailing quantified wear data, as at 322. More particularly, the computer system 204 may be programmed to run a fourth or "auto-generate report" programming instruction, which may be programmed into the 3D modeling and metrology software. The auto-generate report programming instruction may be configured to generate a variety of types of reports. In some embodiments, the auto-generate report programming instruction may be programmed to produce a PDF report with a corresponding data file containing images and tabular quantified wear data for each of the cutting elements 110 (FIGS. 1, 4, and 6A-6B) listed in the data file for the drill bit 100. The PDF report may provide, among other features, color or "heat" maps of the drill bit 100, which detail where erosion occurred and its severity. In such embodiments, a legend may be provided based on pre-determined tolerances of wear severity. Moreover, calculated values for the cutting elements 110 may be placed in a table below each image for user reference.

The PDF report may further provide various images for each blade 104 (FIG. 1) and key areas of interest on the drill bit 100. More specifically, the auto-generate report programming instruction may be configured to obtain and produce still images of each blade 104. In some embodiments, the PDF report may provide gauge diameter calculations, which provide measurements on how much material was lost at or near the gauge pads 112 (FIG. 1) of the drill bit 100.

Figure 7A:
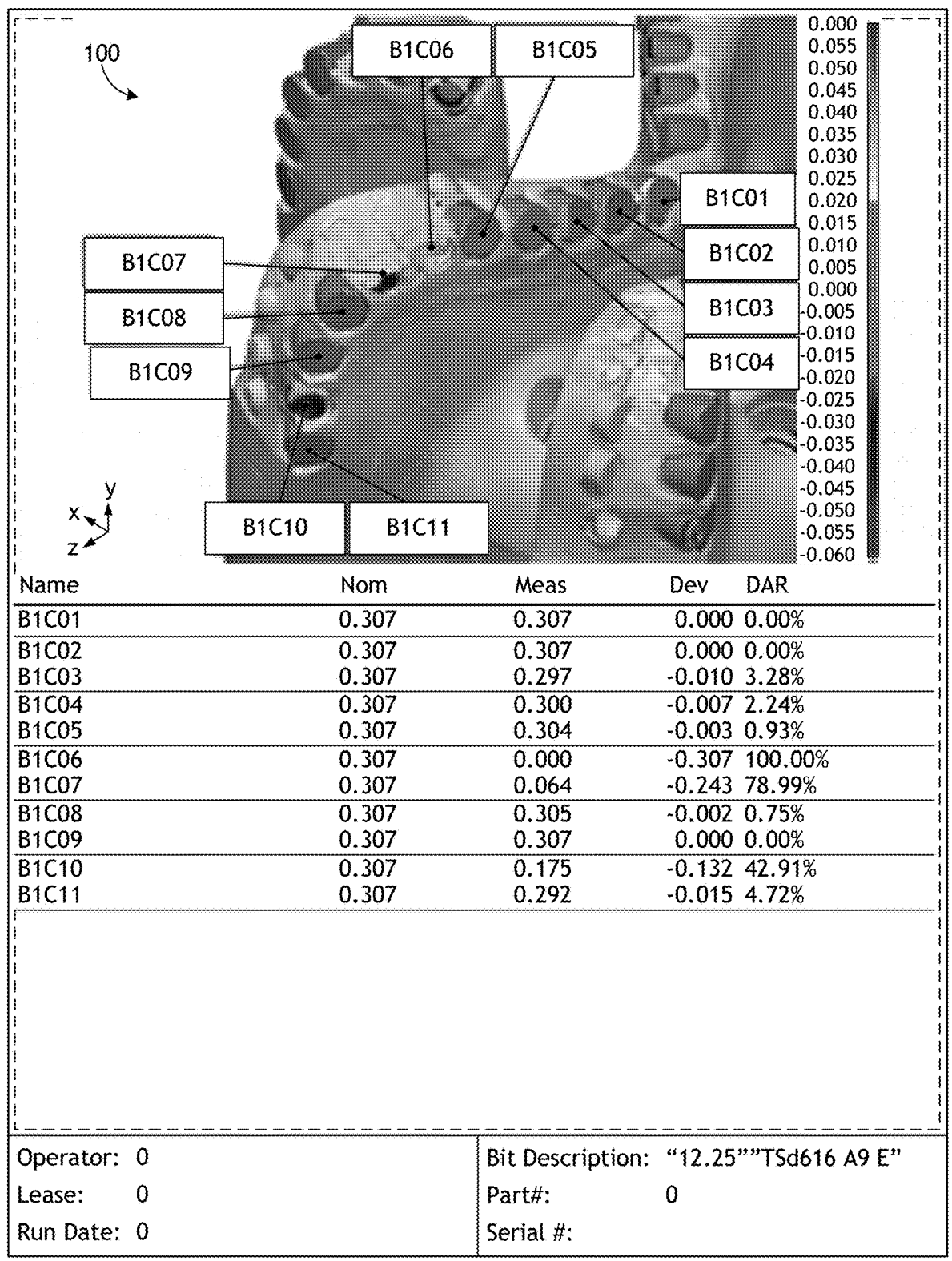

FIGS. 7A-7D depict example wear data reports that may be generated using the auto-generate report programming instruction, according to one or more embodiments. In FIG. 7A, unique annotations may be generated for each cutting element to provide details of wear data; i.e., how much material loss occurred for each individual cutting element. In some embodiments, as illustrated, the severity of material loss may be reported graphically with a color-coded graphical output, where different colors correspond to differing amounts of material loss. The report in FIG. 7A also includes tabular quantified wear data for each of the cutting elements 110. This reporting helps the operator and tool company to visually correlate the tabular wear data to the physical location across the profile of the well tool to better understand potential root causes of the wear.

Figure 7B:
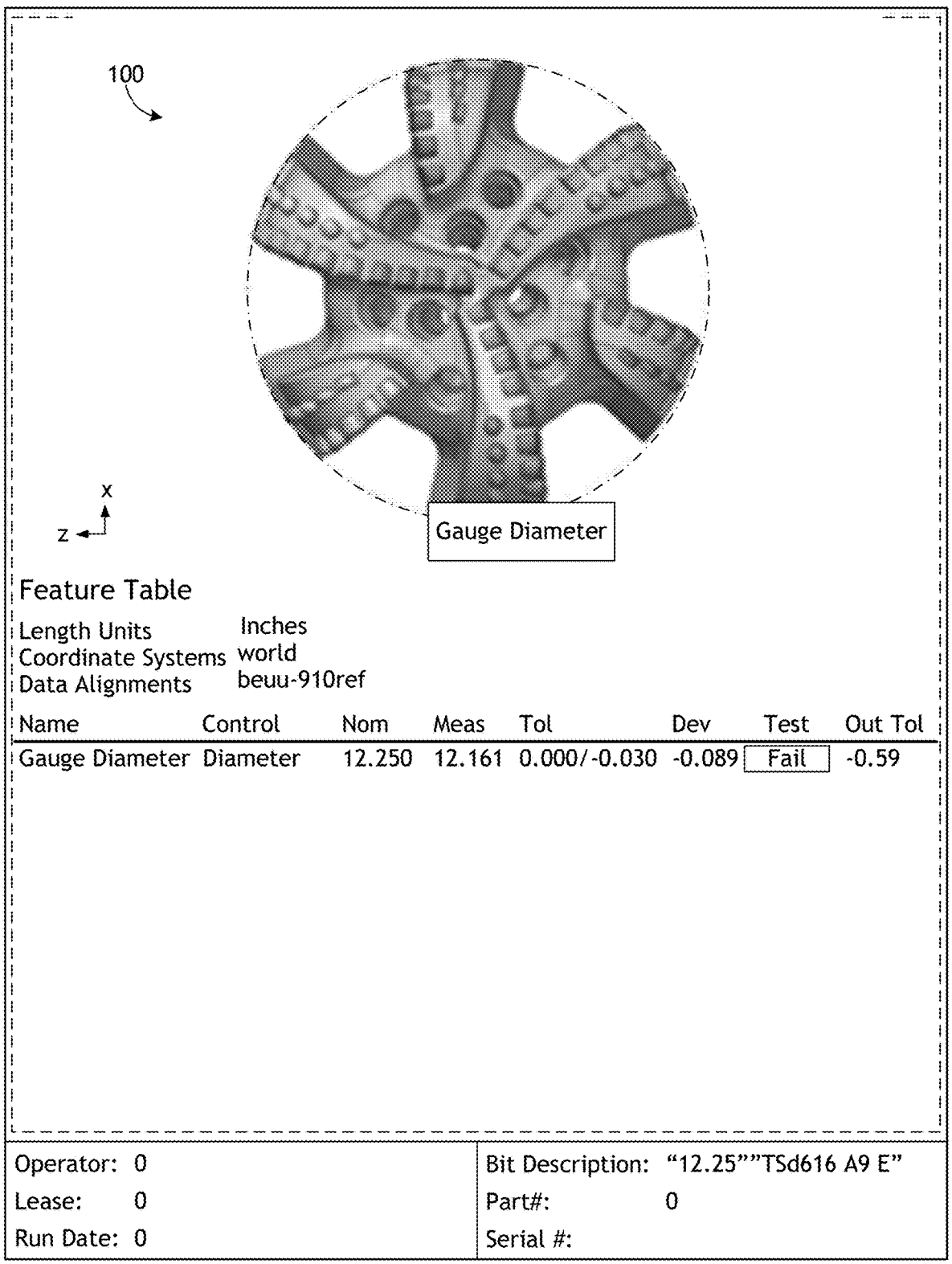

In FIG. 7B, gauge diameter calculations for the drill bit 100 are provided, which provide determinations on how much material was lost at or near the gauge pads 112 (FIG. 1) of the drill bit 100. Accordingly, this report aids in visual correlation of the gauge diameter and how this measurement is being acquired.

Figure 7C:
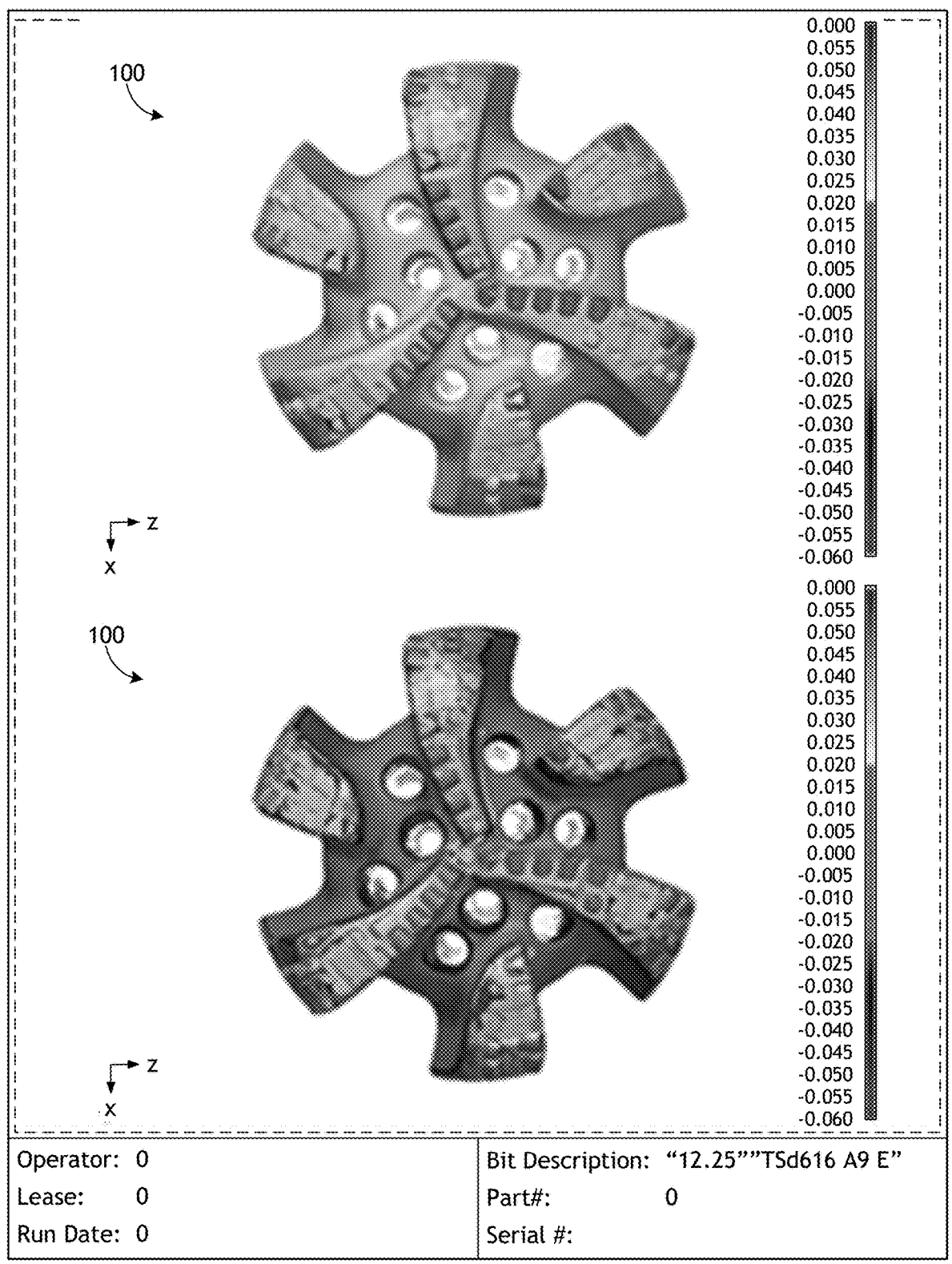

FIG. 7C depicts a report that applies a color map overlay to images of the drill bit 100 as a visual representation of the wear and deviations being reported on the drill bit 100. As indicated above, the severity of material loss may be reported graphically and color-coded, where different colors correspond to differing amounts of material loss. This visual representation of material loss across the entire bit head can be helpful in evaluating hydraulic erosion trends to validate and/or optimize CFD modeling as well as visualizing wear patterns as related to radial location on the bit.

Figure 7D:
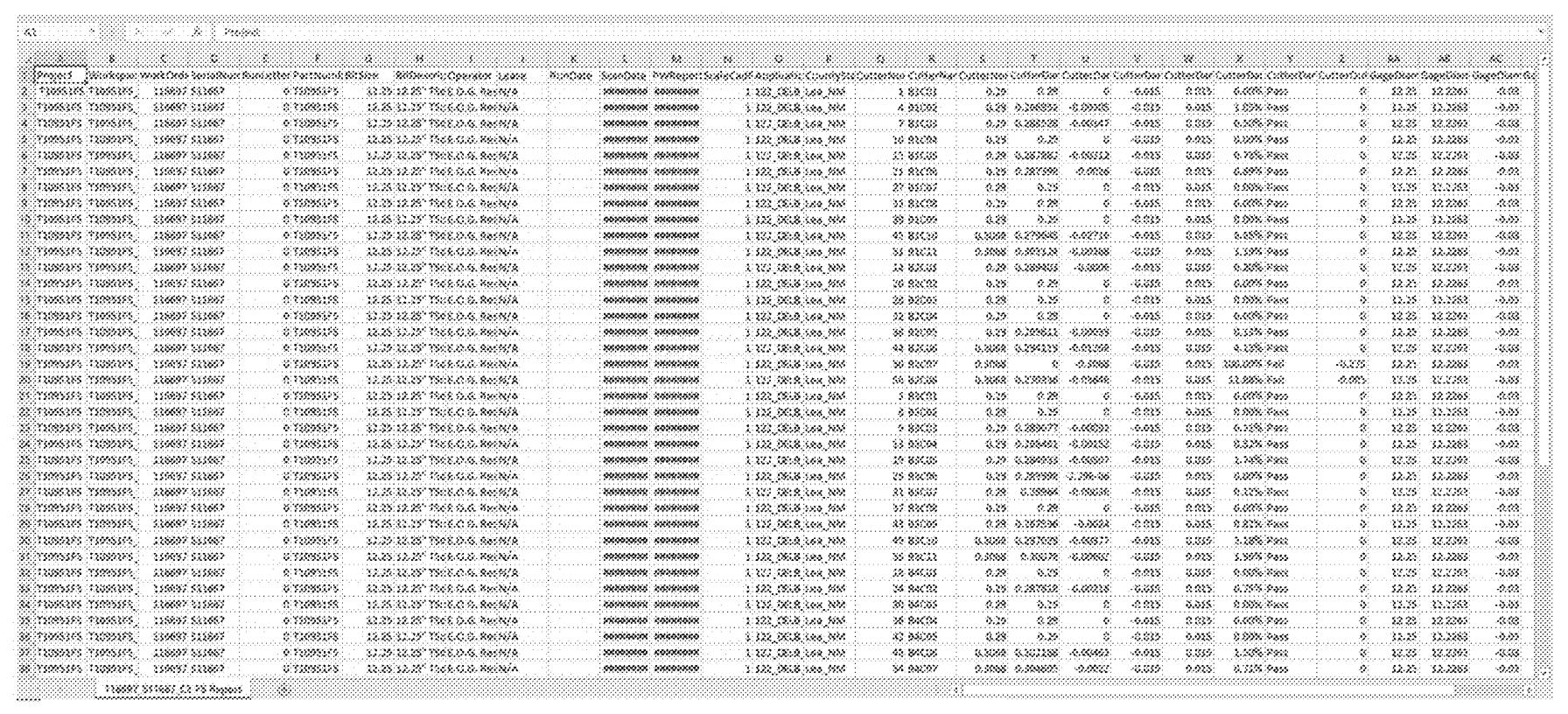

FIG. 7D depicts an example CSV wear report that may be generated following the presently described automated inspection process, according to one or more embodiments. The CSV wear report output (or similar tabular report) may contain large amounts of data captured during the automated inspection process including bit description, application details, nominal area values, measured area values, diamond area removed, gauge diameter, and tolerances, among many other variables/metrics. At least one advantage to having detailed inspection data in a plain text CSV file format is that the user can easily import the comprehensive dataset into many different applications and/or databases for storage and/or analysis.

Once wear data for the drill bit 100 is calculated and collected, it is contemplated herein to optimize subsequent drill bit design and/or manufacturing processes based on the wear data. More specifically, by knowing the drilling conditions the drill bit 100 undertook during operation and the resulting wear data, subsequent drill bits can be designed or manufactured to reinforce certain wear parts or regions of the bit to prolong its lifespan. Optimizing subsequent drill bit design and/or manufacturing, for instance, may entail a correlation analysis to identify volume or rock removed, cut area, weight on bit, torque on bit, distance traveled, hydraulic energy, depth of cut, formation unconfined compressive strength, mechanical specific energy, and other operation parameters. Once the wear for a specific cutting element within the drilling environment is determined, this can be used to optimize the design or cutter type for subsequent drill bits and thereby maximize performance when drilling in similar drilling environments and under similar drilling conditions.

In some embodiments, the methods described herein may include conducting an economic analysis of wear and/or wear rate for various material types to determine association between cost and performance.

In some embodiments, the methods described herein may include correlating electronic drilling recorder (EDR) data to quantified wear data to determine depth of cut and/or energy applied to the well tool. In such embodiments, the EDR data may be compared to the wear data to potentially identify optimal parameters in order to mitigate (reduce) the wear. In some embodiments, this correlation process may allow operators to determine wear rate per foot drilled. In at least one embodiment, correlating the wear rate per foot drilled may take into consideration any forces acting on the individual wear parts of the drill bit; e.g., weight on bit, torque on bit, hydraulic energy, RPM, etc. This analysis may be beneficial in helping to modify the design of the drill bit for improved performance and longevity, and/or optimize the drilling parameters to maximize bit life.

In some embodiments, a wear index may be created and applied for specific drilling applications and/or formations drilled using the drill bit 100, and thereby helping to predict wear probability. The wear index could be created once a large enough data set is obtained and correlated to specific formation drilling applications. The wear index may be obtained or determined, at least in part, by using various statistical analysis and modeling methods, such as linear regression. In such embodiments, coefficients and weights for various known downhole forces may be applied in the analysis and may be useful in predictive modeling that can estimate wear given specific changes to the design and/or materials of the drill bit 100. In at least one embodiment, the wear index could be on a scale of 1-10, but could alternatively be on a different type of scale, without departing from the scope of the disclosure. In such embodiments, increments of the wear index may be equated to certain types of drill bits used in particular drilling applications to maximize performance. Accordingly, the increments of the wear index may correspond to specific drilling applications and/or formations and may include correlation of rock strength analysis and/or unconfined compressive strength (UCS) with wear.

Sectioned Cutters

During the repair process of drill bits (e.g., PDC bits), worn cutters are commonly detached from the cutter pocket and turned (rotated) to orient an unworn or new cutting edge toward the point of contact with the underlying rock. In such processes, worn portion(s) of the cutter are turned (rotated) down into the cutter pocket in order to avoid being directly exposed to contact with the rock being drilled. Some cutters may be turned (rotated) three or four times before scrapping the cutter, and each time the cutter is turned, an undamaged (sharp) cutter edge is exposed and aligned with the point of contact for a subsequent run downhole. This process can save money by utilizing each cutter to its maximum potential.

Figure 8:
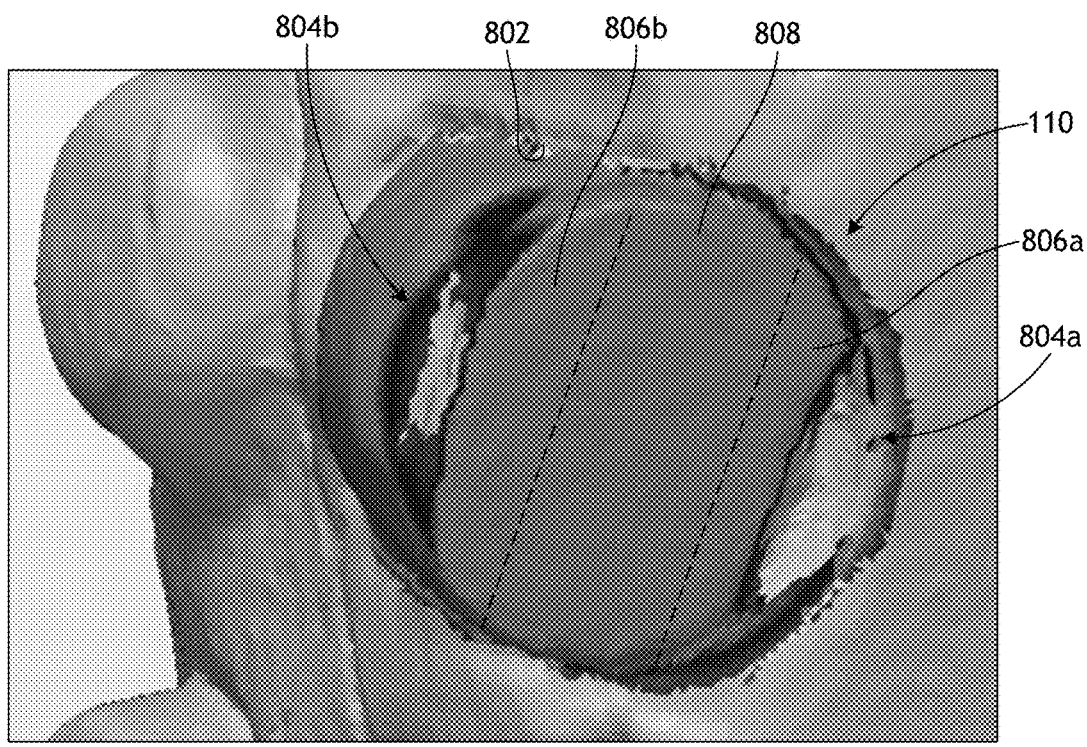
FIG. 8 is an enlarged scanned view of a worn cutter seated within a corresponding cutter pocket, according to one or more embodiments.

Referring to FIG. 8, illustrated is an enlarged scanned view of a worn cutter 110 seated within a corresponding cutter pocket 802. As illustrated, the cutter 110 has a first worn edge 804a and a second worn edge 804b, thus evidencing that the cutter 110 has been used in at least two runs and detached and rotated within the cutter pocket 802, as generally described above. As a result, the first worn edge 804a is oriented away from the point of contact with the rock and the second worn edge 804b is oriented toward the point of contact.

It may be desired to determine the wear and/or diamond area removed (DAR) from the cutting element 110 during the last operation (e.g., the last run or trip downhole). To do this, an operator may follow the steps of the method 300 of FIG. 3, but the resulting wear measurements obtained using the method 300 would be skewed for the last run since it would determine wear and/or DAR for both worn edges 804a,b, whereas the wear and/or DAR for the second worn edge 804b is only desired.

According to embodiments of the disclosure, the CAD file of the cutting element 110 may be digitally divided into two or more sections that include corresponding two or more cutting edge portions of the cutting element 110 to be analyzed for wear. In the illustrated embodiment, the cutting element 110 is digitally divided into a first section 806a and a second section 806b, where the first section 806a encompasses the first worn edge 804a and the second section 806b encompasses the second worn edge 804b. The first section 806a may be characterized as an "unexposed" section since the first worn edge 804a is oriented away from contact with the rock, whereas the second section 806b may be characterized as an "exposed section" since the second worn edge 804a is oriented toward contact with the rock. In this embodiment, the first and second sections 806a,b comprise sections corresponding to approximately 30% of the surface area of the cutter face 808. In other embodiments, however, the sections 806a,b may comprise other surface area percentages of the cutter face 808, such as up to 50% each. In yet other embodiments, the cutting element 110 may be digitally divided into more than two sections, such as three or four sections. In embodiments with four sections, the sections may each encompass 25% of the surface area of the cutter face 808, for example.

In this embodiment, step 320 of the method 300 of FIG. 3 may be modified and otherwise further include calculating the deviation between the solid model file and the scanned file at an exposed section of the cutting element 110, such as the second section 806b, while disregarding (ignoring) the unexposed section(s), such as the first section 806a. As a result, the determination of material removed from the cutting element 110 will be isolated to only the second section 806b, which includes the second worn edge 804b, while any wear present in the first section 806a, including the first worn edge 804a, will be omitted from the resulting wear calculation. As will be appreciated, this will generate wear calculations for the cutting element 110 corresponding to the most recent run, while omitting wear (losses) on the cutting element 110 resulting from any prior runs, which would skew the overall data.

Correlating Wear to Downhole Drilling Dynamics

It is contemplated herein to install various sensors in downhole well tools to obtain data related to the well tool during downhole operation, and correlate that data to subsequent observed wear. More particularly, one or more sensors may be installed in the drill bit 100 and designed to monitor (detect) various downhole drilling dynamics including, but not limited to, vibration, acceleration, shock, orientation, temperature, weight on bit, pressure, or any combination thereof. This data may be tracked to better understand the specific dynamics experienced by the drill bit 100 during operation.

However, such data may also be correlated to the wear experienced on the drill bit 100 during operation to better understand the effect of drilling dysfunctions on cutter wear. This analysis may help an operator optimize drilling parameters, optimize parameter road mapping to mitigate tool dysfunction and wear, aid in bit and/or cutter design, and aid in material selection and optimization to mitigate tool dysfunction and/or wear.

Automating the IADC Dull Grading System

As discussed herein, the International Association of Drill Contractors (IADC) developed and uses a dull bit grading system that provides a standardized protocol for evaluating drill bits and classifying drill bit wear/damage. In the IADC dull grading process, an evaluator visually inspects the dull bit and manually quantifies the observed wear using a standardized eight-field code; i.e., 0 to 8 scale, where 0=no wear, and 8=effective cutting structure completely worn away. The current IADC dull grading system divides the bit into the inner ⅔ diameter of the bit body and the outer ⅓ of the bit body and assigns an average of the wear sustained on the cutters located in the inner ⅔ and the outer ⅓ to the 0 to 8 scale.

According to embodiments of the present disclosure, the basic evaluation principles provided by the IADC dull grading process may be automated using the methods described herein. In the presently disclosed embodiments, the computer system 204 may be programmed divide the bit body 102 (FIG. 1) of the drill bit 100 (FIG. 1) into two or more radial sections extending radially outward from the centerline 108 (FIG. 1) of the bit body 102. In some embodiments, two radial sections may be identified similar to the current IADC methodology, such as the inner ⅔ diameter of the bit body 102 and the outer ⅓ of the bit body 102. In other embodiments, however, other fractions of gauge diameter may be identified extending from the centerline 108. In yet other embodiments, more than two radial sections extending from the centerline 108 may be identified, without departing from the scope of the disclosure.

The average wear of the cutting elements 110 located within each identified radial section may then be determined in accordance with the wear calculation methods described herein, thus providing a percent diamond area removed or "% DAR". The % DAR for each identified radial section may then be correlated with an industry standard dull grading system, such as the IADC system or another system. In such embodiments, the % DAR for each identified radial section may be applied to the IADC 0 to 8 scale and assigned a number between 0 and 8, depending on the resulting (calculated) % DAR. In other embodiments, however, the % DAR may be applied to any other grading scale system, without departing from the scope of the disclosure.

Failure Mode Classification

While understanding the amount of wear sustained is critical in well tool (e.g., drill bit) optimization, understanding the way the wear was ultimately sustained during operation may also be important. By evaluating the characteristics of the wear, such as geometry, magnitude, direction, etc., it may be possible to classify the damage into specific failure modes and thereby facilitate a root cause analysis of the damage. Wear parts can fail due to a variety of root causes, for example, such as abrasion, thermal degradation, mechanical overloading, erosion, corrosion, manufacturing defects, oxidation, or any combination thereof.

Figures 9A, 9B:
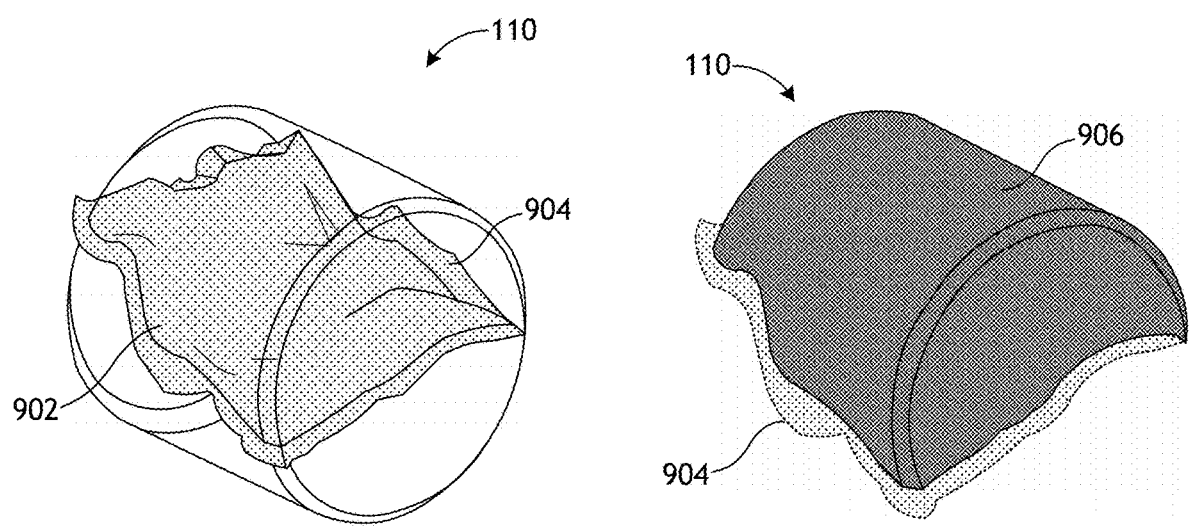
FIG. 9A is an isometric view of an example cutting element after having sustained failure damage and depicting an extracted surface feature created based on the surface of the failure plane.
FIG. 9B is a graphical representation of missing portions of the cutting element of FIG. 9A.

FIG. 9A is an isometric view of an example cutting element 110 that graphically depicts sustained failure damage. More specifically, FIG. 9A depicts a failure surface 902 indicating where a large portion of the cutting element 110 was extracted during operation by reason of failure. According to embodiments of the present disclosure, one or more digital features 904 may be generated to overlay the failure surface 902 and thereby generally follow the surface (contour) of the damage. Similar to the digital features described above with reference to FIGS. 5A-5B, the digital feature(s) 904 applied to the failure surface 902 may constitute computer-generated surfaces overlaid onto the scanned data of the well tool. Depending on the geometry of the resulting digital feature(s) 904, an appropriate failure mode may then be assigned to the worn part. Example failure modes include, but are not limited to, smooth wear, thermal-mechanical wear, cracking, chipping, spalling, tangential fracture/break, delamination, etc.

The computer system 204 may also be programmed and otherwise trained to use machine learning and neural networks to aid in automated failure analysis and classification for individual wear parts. Failure mode classification could be achieved using various forms of artificial intelligence approaches. In example applications using machine or deep learning, example images of common (or less-common) failure modes may be used to train an artificial intelligence model on how to classify the failure modes accurately. In other applications, or in addition thereto, such as in rule-based artificial intelligence systems, the characteristics of the failure modes may be defined within coding in order for the computer system 204 to properly assign a failure classification.

In some embodiments, the resulting digital feature(s) 904 applied to the failure surface may then be compared to the CAD model of the wear part in order to model the missing portion of the wear part. FIG. 9B, for example, shows a graphical representation 906 of the missing part (material) from the cutting element 110 of FIG. 9A. The graphical representation 906 may prove advantageous in helping to determine the geometry and amount (volume) of material lost from the cutting element 110.

Computational Fluid Dynamics

Upon calculating deviation between the solid model file and the scanned file at the digital features for the wear parts, and determining material removed from the wear parts of the well tool, it is also contemplated herein to compare (correlate) the determined wear data to computational fluid dynamics (CFD) modeling. Correlating wear to CFD results, in this instance flow lines, enables an operator (user) to confirm if the damage being sustained is related in some way to drilling fluid circulation, which may result in erosion and/or corrosion. In some embodiments, the CFD modeling may be generated from an add-in within CAD modeling/design software packages (e.g., SolidWorks).

CFD simulations can have a multitude of variables and/or parameters that an operator (user) can adjust to best fit the real world scenario or application. It is often difficult to determine the accuracy of the simulations, thereby leaving much room for ambiguity in selecting the most appropriate parameters to use during simulations. Having highly precise wear quantification, however, provides a much needed feedback system for the CFD analysts to evaluate (or validate) the accuracy of their simulations and adjust the parameters of the models as needed to better match the actual or observed effects of fluids on the well tool. Accordingly, comparing the wear data to CFD modeling may prove advantageous in helping to validate CFD modeling.

Figure 10:
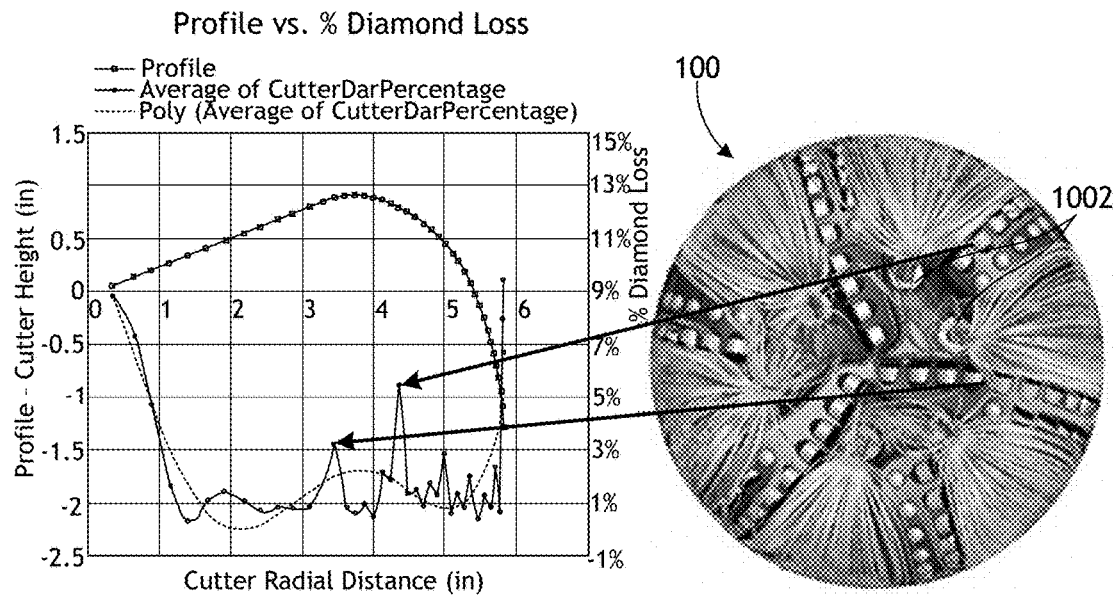
FIG. 10 depicts an example of computational fluid dynamics flow lines across a drill bit being correlated to cutting element wear, according to one or more embodiments.

FIG. 10 depicts an example of observed CFD flow lines across a well tool (e.g., the drill bit 100) being correlated to cutting element wear, according to one or more embodiments. In the illustrated example, flow lines are observed traveling (flowing) across erosion-prone (relative to the diamond table) cutting element substrates on the CFD modeling, and a corresponding spike in % DAR is recorded in the adjoining graph. If the erosion-prone substrate sustains erosion, the diamond table of the cutting element may be left unsupported and is more likely to fail. With this understanding (data), an operator (user, designer, manufacture, etc.) may be able to adjust one or more parameters of the drill bit 100 to help prevent erosion. In some embodiments, for instance, the orientation of nozzles 1002 in the drill bit 100 may be adjusted to reduce the hydraulic flow traveling across the cutting elements, which may reduce the risk of fluid-related damage on the cutting elements. FIG. 10 provides an example of this relationship and phenomenon. Accordingly, in some embodiments, wear patterns identified on the drill bit 100 may be correlated to CFD modeling to optimize hydraulic layouts of the drill bit 100 and thereby minimize fluid erosion.

Figure 11:
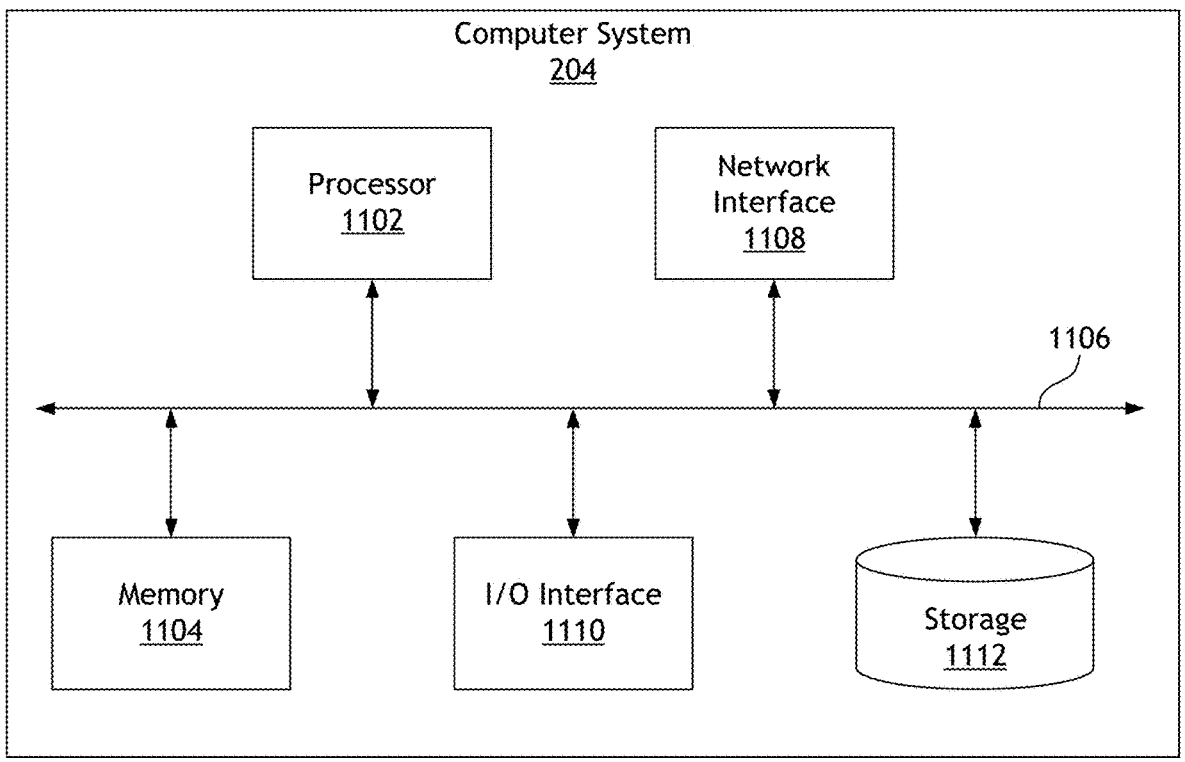
FIG. 11 is a schematic diagram of the computer system of FIG. 2.

FIG. 11 is a schematic diagram of the computer system 204 of FIG. 1. As shown, the computer system 204 includes one or more processors 1102, which can control the operation of the computer system 204. "Processors" are also referred to herein as "controllers." The processor(s) 1102 can include any type of microprocessor or central processing unit (CPU), including programmable general-purpose or special-purpose microprocessors and/or any one of a variety of proprietary or commercially available single or multi-processor systems. The computer system 204 can also include one or more memories 1104, which can provide temporary storage for code to be executed by the processor(s) 1102 or for data acquired from one or more users, storage devices, and/or databases. The memory 1104 can include read-only memory (ROM), flash memory, one or more varieties of random access memory (RAM) (e.g., static RAM (SRAM), dynamic RAM (DRAM), or synchronous DRAM (SDRAM)), and/or a combination of memory technologies.

The various elements of the computer system 204 can be coupled to a bus system 1106. The illustrated bus system 1106 is an abstraction that represents any one or more separate physical busses, communication lines/interfaces, and/or multi-drop or point-to-point connections, connected by appropriate bridges, adapters, and/or controllers. The computer system 204 can also include one or more network interface(s) 1108, one or more input/output (IO) interface(s) 1110, and the one or more storage device(s) 812.

The network interface(s) 1108 can enable the computer system 204 to communicate with remote devices, e.g., other computer systems, over a network, and can be, for non-limiting example, remote desktop connection interfaces, Ethernet adapters, and/or other local area network (LAN) adapters. The IO interface(s) 1110 can include one or more interface components to connect the computer system 204 with other electronic equipment. For non-limiting example, the IO interface(s) 1110 can include high-speed data ports, such as universal serial bus (USB) ports, 1394 ports, Wi-Fi, Bluetooth, etc. Additionally, the computer system 204 can be accessible to a human user, and thus the IO interface(s) 1110 can include displays, speakers, keyboards, pointing devices, and/or various other video, audio, or alphanumeric interfaces.

The storage device(s) 1112 can include any conventional medium for storing data in a non-volatile and/or non-transient manner. In some aspects, the storage device(s) 1112 may be the same as the storage device 138 of FIG. 1. The storage device(s) 1112 can hold data and/or instructions in a persistent state, i.e., the value(s) are retained despite interruption of power to the computer system 204. In at least one aspect, the database 136 of FIG. 1 may be located on the storage device(s) 1112. The storage device(s) 1112 can include one or more hard disk drives, flash drives, USB drives, optical drives, various media cards, diskettes, compact discs, and/or any combination thereof and can be directly connected to the computer system(s) 204 or remotely connected thereto, such as over a network. In an exemplary embodiment, the storage device(s) 1112 can include a tangible or non-transitory computer readable medium configured to store data, e.g., a hard disk drive, a flash drive, a USB drive, an optical drive, a media card, a diskette, a compact disc, etc.

The elements illustrated in FIG. 8 can be some or all of the elements of a single physical machine. In other embodiments, however, and as mentioned above, the computer system 204 may alternatively include two or more computers or physical computing machines networked together or otherwise capable of communicating one with the other to achieve a common goal. In addition, not all of the illustrated elements need to be located on or in the same physical machine. Exemplary computer systems include conventional desktop computers, workstations, minicomputers, laptop computers, tablet computers, personal digital assistants (PDAs), and mobile phones, and the like.

The computer system 204 can include a web browser for retrieving web pages or other markup language streams, presenting those pages and/or streams (visually, aurally, or otherwise), executing scripts, controls and other code on those pages/streams, accepting user input with respect to those pages/streams (e.g., for purposes of completing input fields), issuing HyperText Transfer Protocol (HTTP) requests with respect to those pages/streams or otherwise (e.g., for submitting to a server information from the completed input fields), and so forth. The web pages or other markup language can be in HyperText Markup Language (HTML) or other conventional forms, including embedded Extensible Markup Language (XML), scripts, controls, and so forth. The computer system 204 can also include a web server for generating and/or delivering the web pages to client computer systems.

In an exemplary embodiment, the computer system 204 can be provided as a single unit, e.g., as a single server, as a single tower, contained within a single housing, etc. The single unit can be modular such that various aspects thereof can be swapped in and out as needed for, e.g., upgrade, replacement, maintenance, etc., without interrupting functionality of any other aspects of the system. The single unit can thus also be scalable with the ability to be added to as additional modules and/or additional functionality of existing modules are desired and/or improved upon.

The computer system 204 can also include any of a variety of other software and/or hardware components, including by way of non-limiting example, operating systems and database management systems. Although an exemplary computer system is depicted and described herein, it will be appreciated that this is for the sake of generality and convenience. In other embodiments, the computer system may differ in architecture and operation from that shown and described here.

Embodiments disclosed herein include:

A. A method of quantifying wear data on a well tool includes identifying the well tool based on a solid model file and a data file corresponding to the well tool, wherein the solid model and data files are stored on a computer system and separately identify wear parts of the well tool, scanning the well tool with a scanner and thereby generating a scanned file of the well tool, the scanner being in communication with the computer system, aligning the scanned file with the solid model file to obtain an overlay output, creating digital features on the wear parts of the scanned file, and calculating deviation between the solid model file and the scanned file at the digital features for the wear parts and thereby determining material removed from the wear parts of the well tool.

Embodiment A may have one or more of the following additional elements in any combination: Element 1: wherein the solid model file and the data file comprise design and preparation files corresponding to the well tool, and wherein data in the solid model file and the data file are separable into the wear parts of the well tool. Element 2: wherein identifying the well tool further comprises inputting into the computer system tool data corresponding to the well tool, the tool data including part number, serial number, and operation information for the well tool. Element 3: wherein scanning the well tool is preceded by situating the well tool in a predetermined alignment. Element 4: wherein aligning the scanned file with the solid model file comprises undertaking a manual point pair alignment between the scanned file and the solid model file. Element 5: wherein undertaking the manual point pair alignment comprises marking one or more surfaces in the solid model file with unique identifiers, and marking one or more of the surfaces in the scanned file with corresponding unique identifiers and thereby linking the solid model file to the scanned file. Element 6: wherein aligning the scanned file with the solid model file comprises globally aligning the scanned file with the solid model file by creating a best-fit global alignment between all surfaces of the scanned mesh and solid model files. Element 7: further comprising performing a local alignment of individual wear parts of the well tool. Element 8: wherein the well tool is a drill bit having a plurality of cutting elements fixed to blades, and wherein creating the digital features on the wear parts of the scanned file comprises generating and aligning a digital plane with a cutter face of each cutting element. Element 9: wherein calculating the deviation between the solid model file and the scanned file comprises retrieving nominal values set for a cutter dimension of each cutting element, and comparing the nominal values to the scanned file at the digital planes and thereby quantifying diamond area removed from each cutting element. Element 10: wherein the drill bit further includes gauge pads and creating the digital features on the wear parts of the scanned file further comprises generating and aligning a digital cylinder with the gauge pads. Element 11: wherein calculating the deviation between the solid model file and the scanned file comprises retrieving nominal values set for an outer diameter of the drill bit at the gauge pads, and comparing the nominal values to the scanned file at the digital cylinder and thereby quantifying an amount of material removed at the gauge pads or determining if the gauge pads are out of tolerance. Element 12: further comprising generating one or more reports detailing quantified wear data for each wear part of the well tool. Element 13: wherein the well tool comprises a drill bit, the method further comprising correlating the material removed from the wear parts to performance and thereby producing wear or wear rate per foot drilled. Element 14: further comprising correlating the wear with forces acting on the wear parts of the drill bit, and modifying a design of the drill bit based on correlation of the wear with the forces acting on the wear parts. Element 15: further comprising creating and applying a wear index for specific drilling applications and formations drilled and thereby predicting wear probability. Element 16: wherein the well tool comprises a drill bit and the wear parts include a cutting element secured to the drill bit, and wherein calculating the deviation between the solid model file and the scanned file comprises dividing the solid model file of the cutting element into two or more sections that include corresponding two or more cutting edge portions to be analyzed for wear, wherein one of the two or more sections is an exposed section while remaining sections of the two or more sections are unexposed sections, calculating the deviation between the solid model file at the exposed section and the scanned file, and disregarding deviation between the solid model file at the unexposed section and the scanned file. Element 17: wherein the well tool comprises a drill bit with a bit body having a centerline, and wherein the method further comprises dividing the bit body into two or more radial sections extending radially outward from the centerline, calculating an average wear of cutting elements located within each radial section and thereby determining a percent diamond area removed (% DAR) for each radial section, and correlating the % DAR for each radial section with an industry standard dull grading system. Element 18: further comprising comparing the material removed from the wear parts to computational fluid dynamics (CFD) modeling results of the well tool, correlating the CFD modeling results to the material removed, and adjusting one or more parameters of the well tool to prevent erosion based on the CFD modeling results and the material removed. Element 19: wherein creating the digital features on the wear parts of the scanned file comprise overlaying a failure surface on one of the wear parts with a plurality of computer-generated digital features, and assigning a failure mode to the failure surface based on a geometry of the plurality of computer-generated digital features. Element 20: further comprising calculating deviation between the solid model file and the scanned file at the failure surface of the one of the wear parts, and graphically modeling an amount removed from the one of the wear parts based on the plurality of computer-generated digital features. Element 21: wherein assigning the failure mode to the failure surface comprises training the computer system with a plurality of known failure mode images, and classifying the failure mode with the computer system based on the plurality of known failure mode images. Element 22: wherein the well tool comprises oilfield equipment selected from the group consisting of a rotary drill bit, a bit body associated with a rotary drill bit, a fixed cutter drill bit, a drill string stabilizer, a roller cone drill bit, a cone for a roller cone drill bit, a rotary steering tool, a logging while drilling tool, a measurement while drilling tool, a side wall coring tool, an underreamer, a fishing spear, a washover tool, a whipstock, a production packer component, float equipment, a casing shoe, a well screen, a gas lift mandrel, a downhole tractor, a tool joint, a rotor for a downhole motor, a stator for a downhole motor, a blades for a downhole turbine, a latch for a downhole tool, and any combination thereof.

By way of non-limiting example, exemplary combinations applicable to embodiment A include: Element 4 with Element 5; Element 6 with Element 7; Element 8 with Element 9; Element 9 with Element 10; Element 10 with Element 11; Element 13 with Element 14; Element 13 with Element 15; Element 19 with Element 20; and Element 19 with Element 21.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

What is claimed is:

1. A method of quantifying wear data on a well tool, comprising:
 scanning a used well tool with a scanner to capture a plurality of images representing the used well tool, the scanner being in communication with a computer system, wherein the used well tool comprises a drill bit with a bit body having a centerline;
 dividing the bit body into two or more radial sections extending radially outward from the centerline;
 constructing, based on the plurality of images, a complex polygon mesh structure, and thereby generating a scanned file of the complex polygon mesh structure;
 aligning the scanned file with an original solid model file of the used well tool and thereby obtaining and displaying an overlay output comprising individual overlayed wear parts, wherein the solid model file is stored on the computer system and identifies individual wear parts of the used well tool;
 creating and placing a digital feature on one or more of the individual overlayed wear parts displayed on the overlay output;
 calculating deviation between the solid model file and the scanned file at each digital feature of the one or more individual wear parts and thereby determining material removed from the individual wear parts of the used well tool;

calculating an average wear of cutting elements located within each radial section and thereby determining an amount of material removed from cutting elements for each radial section; and correlating the % diamond area removed for each radial section with an industry standard dull grading system.

2. The method of claim 1, further comprising identifying the used well tool based on the original solid model file and a data file corresponding to the used well tool, wherein the original solid model and data files comprise design and preparation files stored on the computer system and corresponding to an original manufacturer specification for the used well tool, and wherein the original solid model and data files are separable into the individual wear parts of the well tool to identify the individual wear parts.

3. The method of claim 1, wherein aligning the scanned file with the solid model file comprises:

separately displaying the scanned and solid model files on a computer screen in communication with the computer system; and undertaking a manual point pair alignment between the scanned file and the solid model file.

4. The method of claim 3, wherein undertaking the manual point pair alignment comprises:

manually marking surfaces of the solid model file displayed on the computer screen with unique identifiers; and manually marking surfaces of the scanned file displayed on the computer screen with corresponding unique identifiers and thereby linking the solid model file to the scanned file.

5. The method of claim 1, wherein aligning the scanned file with the solid model file comprises globally aligning the scanned file with the solid model file by creating a best-fit global alignment between all surfaces of the scanned file and solid model files.

6. The method of claim 1, wherein aligning the scanned file with the solid model file comprises performing a local alignment of the individual wear parts of the well tool by manually aligning each wear part of the used well tool provided by the scanned file on a one-by-one basis with corresponding wear parts provided by the solid model file.

7. The method of claim 1, wherein calculating the deviation between the solid model file and the scanned file comprises:

retrieving a nominal value set for a cutter dimension of at least one of the cutting elements; and comparing the nominal value to the scanned file and thereby quantifying diamond area removed from the at least one of the cutting elements.

8. The method of claim 1, wherein creating and placing the digital feature on the one or more of the individual wear parts comprises generating and aligning a digital plane with a cutting element face of at least one of the cutting elements.

9. The method of claim 8, wherein calculating the deviation between the solid model file and the scanned file comprises measuring a distance from the digital plane to scanned surfaces of the scanned file at the least one of the cutting elements.

10. The method of claim 1, wherein creating and placing the digital features on the one or more of the wear parts comprises generating and aligning a digital cylinder with at least one of the gauge pads and the gauge cutters, and wherein calculating the deviation between the solid model file and the scanned file comprises:

retrieving a nominal value set for an outer diameter of the drill bit at the gauge pads or the gauge cutters; and comparing the nominal value to the scanned file at the digital cylinder and thereby quantifying an amount of material removed at the gauge pads or the gauge cutters.

11. The method of claim 1, wherein the used well tool comprises a drill bit, the method further comprising correlating the material removed from the wear parts to performance and thereby producing wear or wear rate per foot drilled.

12. The method of claim 11, further comprising:

correlating the wear with forces acting on the wear parts of the drill bit; and modifying a design of the drill bit based on correlation of the wear with the forces acting on the wear parts.

13. The method of claim 11, further comprising creating and applying a wear index for specific drilling applications and formations drilled and thereby predicting wear probability.

14. The method of claim 1, wherein calculating the deviation between the solid model file and the scanned file comprises:

dividing the solid model file of one of the cutting elements into two or more sections that include corresponding two or more cutting edge portions to be analyzed for wear, wherein one of the two or more sections is an exposed section while remaining sections of the two or more sections are unexposed sections;

calculating the deviation between the solid model file at the exposed section and the scanned file; and disregarding deviation between the solid model file at the unexposed section and the scanned file.

15. The method of claim 1, further comprising:

comparing the material removed from the wear parts to computational fluid dynamics (CFD) modeling results of the used well tool;

correlating the CFD modeling results to the material removed; and adjusting one or more parameters of the used well tool to prevent erosion based on the CFD modeling results and the material removed.

16. The method of claim 1, wherein creating the digital features on the wear parts of the scanned file comprise:

overlaying a failure surface on one of the wear parts with a plurality of computer-generated digital features; and assigning a failure mode to the failure surface based on a geometry of the plurality of computer-generated digital features.

17. The method of claim 16, further comprising:

calculating deviation between the solid model file and the scanned file at the failure surface of the one of the wear parts; and graphically modeling an amount removed from the one of the wear parts based on the plurality of computer-generated digital features.

18. The method of claim 1, further comprising:

training a neural network stored on the computer system with a plurality of known failure mode images and thereby categorizing common failure modes sustained by used drill bits during operation;

scanning the drill bit with a scanner in communication with the computer system and thereby generating a scanned file of the drill bit; and classifying, with the neural network, one or more failure modes sustained by the drill bit and based on the scanned file.

19. The method of claim 18, further comprising assigning a failure classification based on a characteristic of the one or more failure modes.

20. A system, comprising:
a scanner arrangeable to scan a used well tool that includes a drill bit with a bit body having a centerline; and
a computer system in communication with the scanner and including a non-transitory, computer readable medium programmed with computer executable instructions that, when executed by a processor of the computer system, performs the steps of:
dividing the bit body into two or more radial sections extending radially outward from the centerline;
constructing a complex polygon mesh structure based on one or more signals received from the scanner, wherein the one or more signals convey a plurality of images representing the used well tool;
generating a scanned file of the complex polygon mesh structure;
aligning the scanned file with an original solid model file of the used well tool and thereby obtaining and displaying an overlay output comprising individual overlayed wear parts, wherein the solid model file is stored on the computer system and identifies individual wear parts of the used well tool;
creating and placing a digital feature on one or more of the individual overlayed wear parts displayed on the overlay output;
calculating deviation between the solid model file and the scanned file at each digital feature of the one or more individual wear parts and thereby determining material removed from the individual wear parts of the used well tool;
calculating an average wear of cutting elements located within each radial section and thereby determining an amount of material removed from cutting elements for each radial section; and
correlating the % diamond area removed for each radial section with an industry standard dull grading system.

* * * * *